United States Patent
Nakata

(10) Patent No.: US 11,252,315 B2
(45) Date of Patent: Feb. 15, 2022

(54) IMAGING APPARATUS AND INFORMATION PROCESSING METHOD

(71) Applicant: SONY INTERACTIVE ENTERTAINMENT INC., Tokyo (JP)

(72) Inventor: Masashi Nakata, Kanagawa (JP)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 142 days.

(21) Appl. No.: 16/631,545

(22) PCT Filed: Aug. 4, 2017

(86) PCT No.: PCT/JP2017/028461
§ 371 (c)(1),
(2) Date: Jan. 16, 2020

(87) PCT Pub. No.: WO2019/026287
PCT Pub. Date: Feb. 7, 2019

(65) Prior Publication Data
US 2020/0213487 A1  Jul. 2, 2020

(51) Int. Cl.
*H04N 9/80* (2006.01)
*H04N 5/225* (2006.01)
(Continued)

(52) U.S. Cl.
CPC ..... *H04N 5/2254* (2013.01); *H04N 5/232122* (2018.08); *H04N 5/247* (2013.01); *H04N 9/07* (2013.01)

(58) Field of Classification Search
USPC .................................. 386/248, 278; 348/135
See application file for complete search history.

(56) References Cited

U.S. PATENT DOCUMENTS 8,441,088 B2 * 5/2013 Ooka ................ H01L 31/02327
257/432
8,947,564 B2 * 2/2015 Hirota ...................... G02B 5/20
348/279

(Continued)

FOREIGN PATENT DOCUMENTS

EP         0999518 A1    5/2000
JP      2009-058533 A    3/2009
(Continued)

OTHER PUBLICATIONS

Gary Atkinson and Edwin R. Hancock, "Recovery of Surface Orientation from Diffuse Polarization," IEEE Transactions on Image Processing, Jun. 2006, 15(6), pp. 1653-1664.
(Continued)

*Primary Examiner* — Nigar Chowdhury
(74) *Attorney, Agent, or Firm* — Katten Muchin Rosenman LLP

(57) ABSTRACT

In a pixel 110, a microlens layer 112 includes a microlens for each pixel region. A color filter layer 114 allows passage of light of a given color. A polarizer layer 116 includes a polarizer that allows passage of a polarization component in a given direction in some or all pixel regions and acquires a normal vector of a subject through a detection value thereof. A photoelectric conversion layer 118 includes a plurality of photodiodes in the pixel regions. A distance to a feature point of the subject is acquired through phase difference based on the detection value.

17 Claims, 16 Drawing Sheets

(51) Int. Cl.
  *H04N 5/232* (2006.01)
  *H04N 5/247* (2006.01)
  *H04N 9/07* (2006.01)
  *G11B 27/00* (2006.01)
  *H04N 5/93* (2006.01)

(56) References Cited

U.S. PATENT DOCUMENTS

| | | | |
|---|---|---|---|
| 9,392,231 B2* | 7/2016 | Kanamori | H04N 9/04557 |
| 9,674,493 B2* | 6/2017 | Li | H04N 9/04557 |
| 9,691,802 B2* | 6/2017 | Sambongi | G06K 9/52 |
| 9,787,952 B2* | 10/2017 | Hsu | H04N 5/3696 |
| 9,800,861 B2* | 10/2017 | Nagata | H04N 13/232 |
| 10,032,817 B2* | 7/2018 | Takimoto | G02B 5/008 |
| 10,178,361 B2* | 1/2019 | Itoh | H04N 9/04 |
| 10,593,304 B2* | 3/2020 | Nakao | G09G 3/3614 |
| 10,638,054 B2* | 4/2020 | Komori | H04N 5/332 |
| 10,725,216 B2* | 7/2020 | Hirata | H04N 5/238 |
| 2010/0253820 A1 | 10/2010 | Kanamori et al. | |
| 2010/0282945 A1* | 11/2010 | Yokogawa | H04N 5/335 250/208.1 |
| 2013/0106997 A1* | 5/2013 | Kim | H04S 5/00 348/43 |
| 2013/0195349 A1* | 8/2013 | Yamashita | G06T 15/80 382/154 |
| 2013/0304392 A1* | 11/2013 | Deciu | G16B 20/20 702/20 |
| 2014/0028873 A1* | 1/2014 | Higuchi | H04N 5/2352 348/229.1 |
| 2015/0071362 A1* | 3/2015 | Uchiumi | H04N 19/597 375/240.26 |
| 2016/0234425 A1 | 8/2016 | Katagawa | |
| 2016/0277758 A1* | 9/2016 | Ikai | H04N 19/157 |
| 2017/0323465 A1* | 11/2017 | Nakada | G06T 5/002 |
| 2017/0354326 A1* | 12/2017 | Pugh | A61B 3/10 |
| 2017/0367582 A1* | 12/2017 | Wang | G06T 11/001 |

FOREIGN PATENT DOCUMENTS

| | | |
|---|---|---|
| JP | 2010-166580 A | 7/2010 |
| JP | 2012-80065 A | 4/2012 |
| JP | 2013-106194 A | 5/2013 |
| JP | 2016-144183 A | 8/2016 |
| JP | 2017-017563 | 1/2017 |

OTHER PUBLICATIONS

International Search Report and Written Opinion dated Oct. 31, 2017, from International Application No. PCT/JP2017/028461, 15 sheets.

International Preliminary Report on Patentability dated Feb. 13, 2020, from International Patent Application No. PCT/JP2017/028461, 29 sheets.

* cited by examiner

FIG.15
(a) (b) (c)
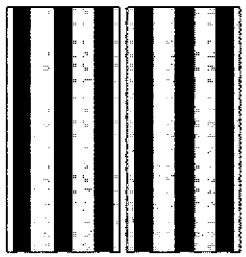
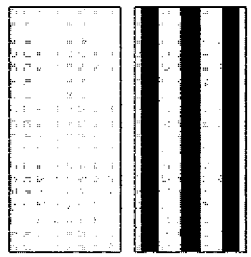
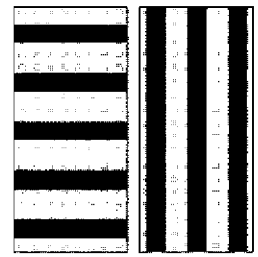
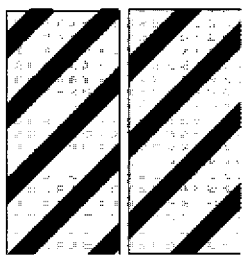
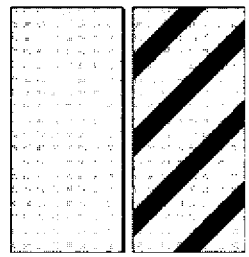
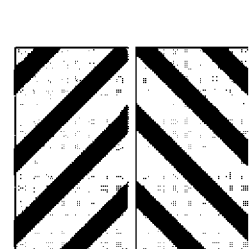
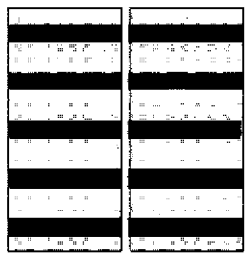
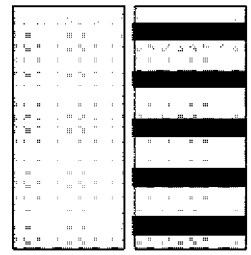
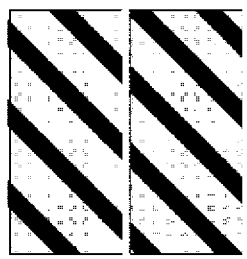
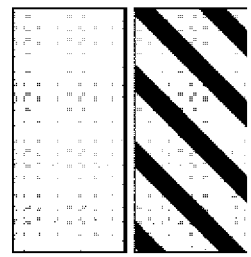

280

IMAGING APPARATUS AND INFORMATION PROCESSING METHOD

TECHNICAL FIELD

The present invention relates to a technology for acquiring information regarding a state of a subject space through shooting.

BACKGROUND ART

Games are known in which a user's body or a marker is shot with a camera and a region of that silhouette is replaced by another image and displayed on a display (refer, for example, to PTL 1). A technique for acquiring a subject's position or a camera's own position or motion and recognizing subject's attributes by detecting and analyzing a silhouette in a shot image has found widespread application not only in cameras incorporated in gaming consoles and information terminals but also in systems including surveillance cameras, vehicle-mounted cameras, robot-mounted cameras, and so on.

CITATION LIST

Patent Literature

[PTL 1]
EP 0999518A1

SUMMARY

Technical Problems

In the technologies as described above, it is always an important challenge to accurately identify the distance to the subject. In order to acquire distance information in general, however, a complicated camera system and a large amount of signal processing time are required. A typical technique for acquiring distance value at the same time as image shooting uses stereo images shot at the same time from left and right viewpoints with a stereo camera and finds the distance by the principle of triangulation from parallax between corresponding points. This technique is premised on the fact that a feature point can be detected from stereo images. Therefore, in the case of a subject with scant feature points such as a monochromatic and flat surface, accuracy may deteriorate, or distance may not be found.

Also, the same feature point needs to appear in both stereo images. Therefore, the distance value cannot be found for a location that is visible only from one of the left and right viewpoints. Further, it is necessary to process each piece of output data from the stereo camera, thus requiring more processing resources and consuming more power than a monocular camera.

Not only time of flight (TOF) that shines infrared light and calculates a distance value on the basis of time required until detection of reflected light but also the techniques using reference light that shine a dot-shaped pattern of infrared light, use the pattern as feature points, and find the distance from the stereo images have a problem in that the detection accuracy deteriorates under sun. Even in the case where reference light is not used, a shot silhouette may change depending on whether it is shot indoors or outdoors, the number of lighting fixtures and their brightness, and lighting conditions in the shooting environment, possibly affecting the accuracy of image analysis.

The present invention has been devised in light of the foregoing problems, and it is an object of the present invention to provide a technology for acquiring information regarding a subject with ease and with accuracy by using a shot image. It is another object of the present invention to provide a technology for acquiring various types of information from a shot image with stable accuracy.

Solution to Problems

A mode of the present invention relates to an imaging apparatus. The imaging apparatus includes, in a pixel arrangement, a microlens, a polarizer layer including a polarizer that allows passage, of light that has passed through the microlens, of a polarization component in a given direction, and a photoelectric conversion section, a unit of conversion of light that has passed through the microlens into electric charge. The imaging apparatus includes an imaging element including a pixel having the photoelectric conversion section in each of a plurality of partial regions obtained by dividing a pixel region corresponding to the single microlens.

Another mode of the present invention relates to an information processing method. The information processing method includes the steps of: by an information processing apparatus, acquiring distance image data each piece of which is acquired from one of shot images from a plurality of viewpoints, from an imaging apparatus, generating information regarding a subject's position in a three-dimensional (3D) space by combining the distance images from the plurality of viewpoints, and generating output data by using the information regarding the position in the 3D space and outputting the data.

It should be noted that arbitrary combinations of the above constituent elements and conversions of expressions of the present invention between a method, an apparatus, and so on are also effective as modes of the present invention.

Advantageous Effects of Invention

The present invention allows for acquisition of information regarding a subject with ease and with accuracy by using a shot image. Also, the present invention allows for acquisition of various types of information from a shot image with stable accuracy.

BRIEF DESCRIPTION OF DRAWINGS

FIG. 15 depicts diagrams illustrating polarizer variations in terms of values of pixels with a polarizer in the present embodiment.

DESCRIPTION OF EMBODIMENTS

Figure 1:
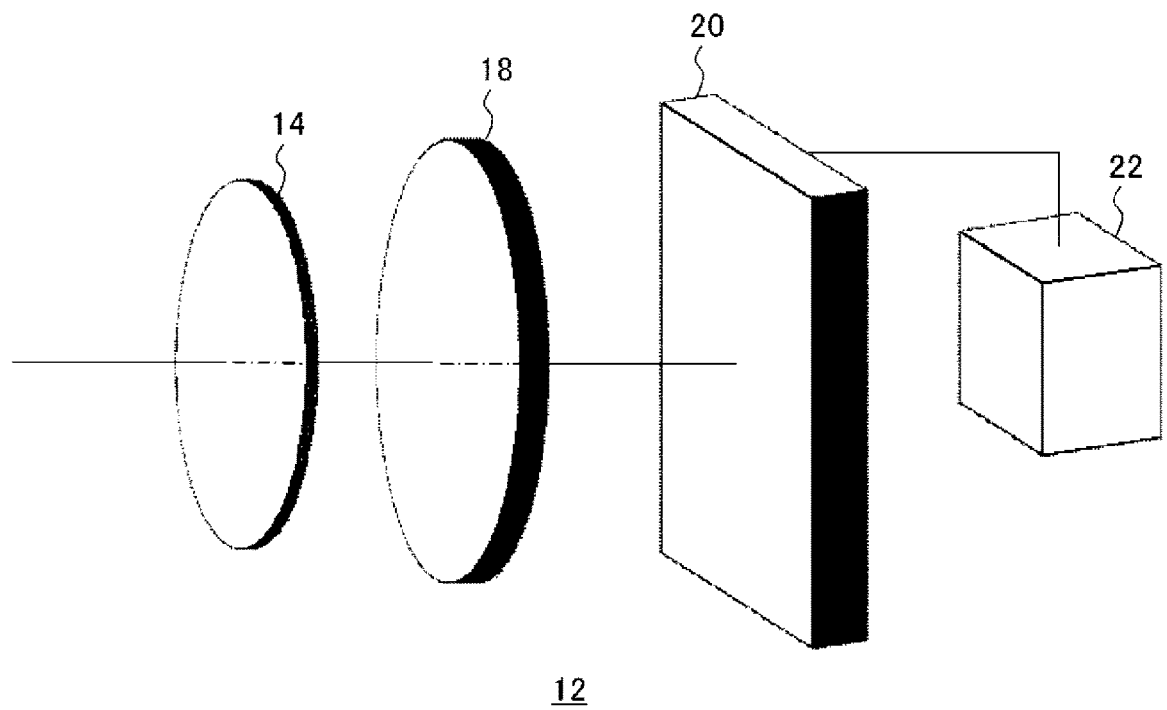
FIG. 1 is a diagram conceptually illustrating a configuration of an imaging apparatus in the present embodiment.

FIG. 1 is a diagram conceptually illustrating a configuration of an imaging apparatus in the present embodiment. An imaging apparatus 12 includes an image forming optics 14, an aperture 18, an imaging element 20, and an image processing section 22. The image forming optics 14 has an ordinary configuration including a focusing lens that forms a subject image on an imaging surface of the imaging element 20. It should be noted that FIG. 1 typically illustrates a single lens. The aperture 18 includes an opening portion and has an ordinary configuration for adjusting the amount of incident light by changing a diameter of the aperture.

The imaging element 20 has a second-dimensional (2D) layout of pixels, converting intensity of incident light into electric charge and outputting the electric charge to the image processing section 22. Pixels in the present embodiment include, at least, a microlens, a polarizer, and photodiodes that are integrally stacked one on top of the other. Here, a plurality of photodiodes are provided for each microlens, thus providing phase difference images obtained by dividing incident light into two images. In the description given below, we assume that a region corresponding to a microlens is a pixel region.

That is, a plurality of photodiodes are provided for each pixel. It should be noted that although a photodiode is a typical example of a mechanism that converts the intensity of incident light into electric charge, there is no intention to limit the present embodiment thereto. That is, the present embodiment can be similarly realized by adopting any photoelectric conversion mechanism in place of photodiodes, and any mechanism for converting light into electric charge can be used to replace photodiodes. Also, a polarizer may be provided in each of all pixels or discretely in some pixels.

The image processing section 22 performs image processing using a 2D distribution of luminance of light output from the imaging element 20, generating an ordinary color image and a distance image representing distances to the subject with pixel values. It should be noted that the imaging apparatus 12 may further include operation means manipulated by the user and a mechanism for performing an imaging action to suit the operation content and an adjusting action of imaging condition. Also, the imaging apparatus 12 may further include a mechanism for establishing communication with an external information processing apparatus such as gaming console in a wired or wireless manner and sending generated data and receiving control signals such as data transmission request. It should be noted, however, that these mechanisms need only be similar to those of ordinary imaging apparatuses. Therefore, the description thereof is omitted.

Figure 2:
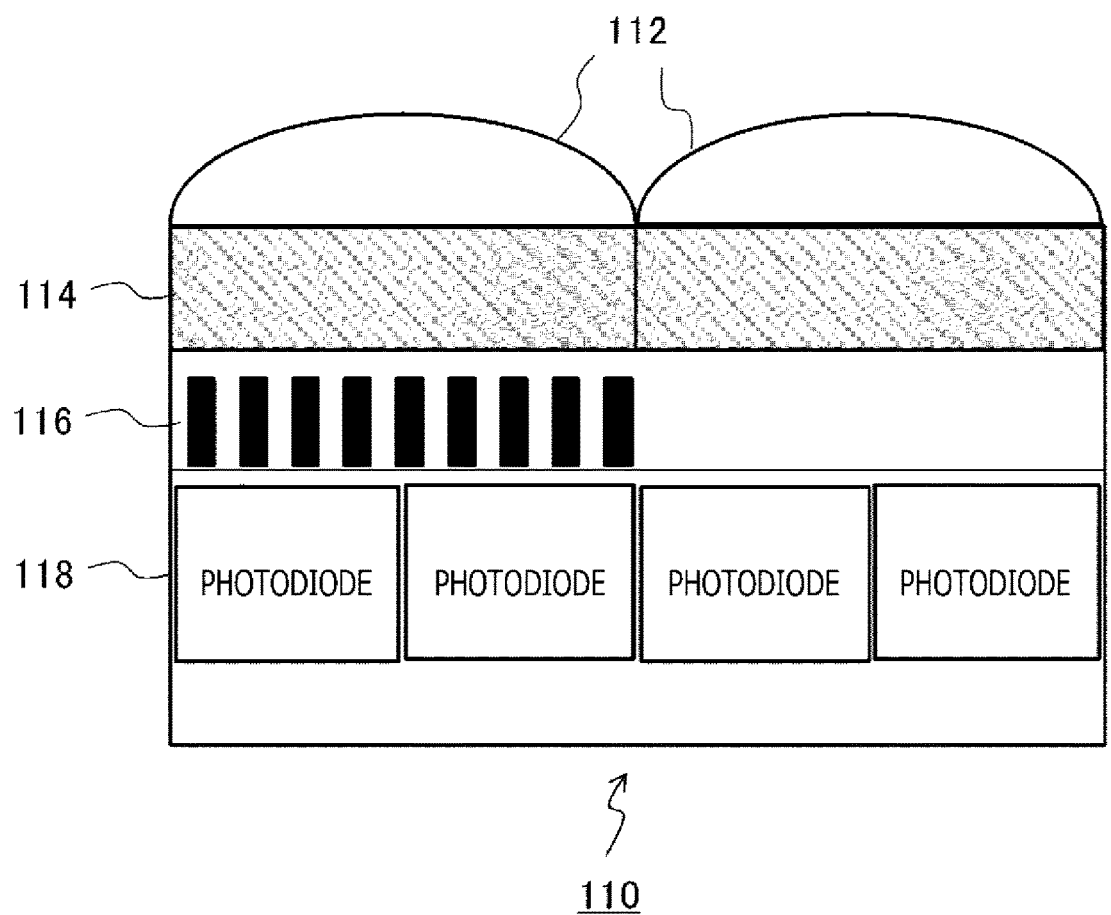
FIG. 2 is a diagram illustrating a structural example of pixels of the imaging apparatus in the present embodiment.

FIG. 2 illustrates a structural example of pixels of the imaging apparatus 12. It should be noted that FIG. 2 schematically illustrates a functional structure of a cross section of an element, and a detailed structure such as interlayer insulating film and wiring are not depicted. Also, FIG. 2 illustrates a cross-sectional structure of two pixels adjacent to each other. A pixel 110 includes a microlens layer 112, a color filter layer 114, a polarizer layer 116, and a photoelectric conversion layer 118. The microlens layer 112 is provided for each pixel and converges incident light that enters the microlens layer 112 via the aperture 18.

The color filter layer 114 allows passage of light of a different color for each pixel. The polarizer layer 116 includes a wire grid polarizer formed by arranging a plurality of linear conductor members such as tungsten or aluminum members (wires) in a striped pattern at an interval smaller than a wavelength of incident light. When light that has been converged by the microlens layer 112 and that has passed through the color filter layer 114 enters the polarizer layer 116, polarization components parallel to a polarizer line are reflected, thus allowing passage of only those polarization components perpendicular to the polarizer line.

Polarization luminance is acquired by converting the polarization components that have passed through the photoelectric conversion layer 118 into electric charge. The technology for acquiring an image by using a wire grid polarizer as illustrated in FIG. 2 is disclosed, for example, in Japanese Patent Laid-Open No. 2012-80065. It should be noted, however, that the element structure of the imaging apparatus 12 in the present embodiment is not limited to that illustrated. For example, the polarizer is not limited to the wire grid type and may be any one of commercial polarizers such as linear dichroic polarizer. It should be noted that although FIG. 2 illustrates the cross section of wires that extend in a depth direction, there are four principal axis angles for the polarizer, and the wire orientation varies depending on the principal axis angle.

Also, as illustrated in FIG. 2, the pixel has a polarizer in some regions of the polarizer layer 116 and has no polarizer in other regions thereof. In the regions where no polarizer is provided, light that has passed through the color filter layer 114 enters the photoelectric conversion layer 118 in an 'as-is' manner. The photoelectric conversion layer 118 includes ordinary photodiodes and outputs incident light as electric charge. In the present embodiment as described above, a plurality of photodiodes are provided for each microlens, thus allowing light beams that have passed through different regions of the focusing lens to be converted into electric charge separately.

The technology for detecting a focal point on the basis of a phase difference between the light beams detected in this manner has been commercialized as a phase difference autofocus technique (refer, for example, to Japanese Patent Laid-Open No. 2013-106194). In the present embodiment, the distance to a subject is acquired by taking advantage of phase difference. Summing up the detected values of the plurality of photodiodes provided in a pixel provides luminance for one pixel in an ordinary imaging apparatus. That is, the pixel configuration illustrated in FIG. 2 allows an ordinary color image, a distance image, and a polarization image to be acquired at the same time.

Figure 3:
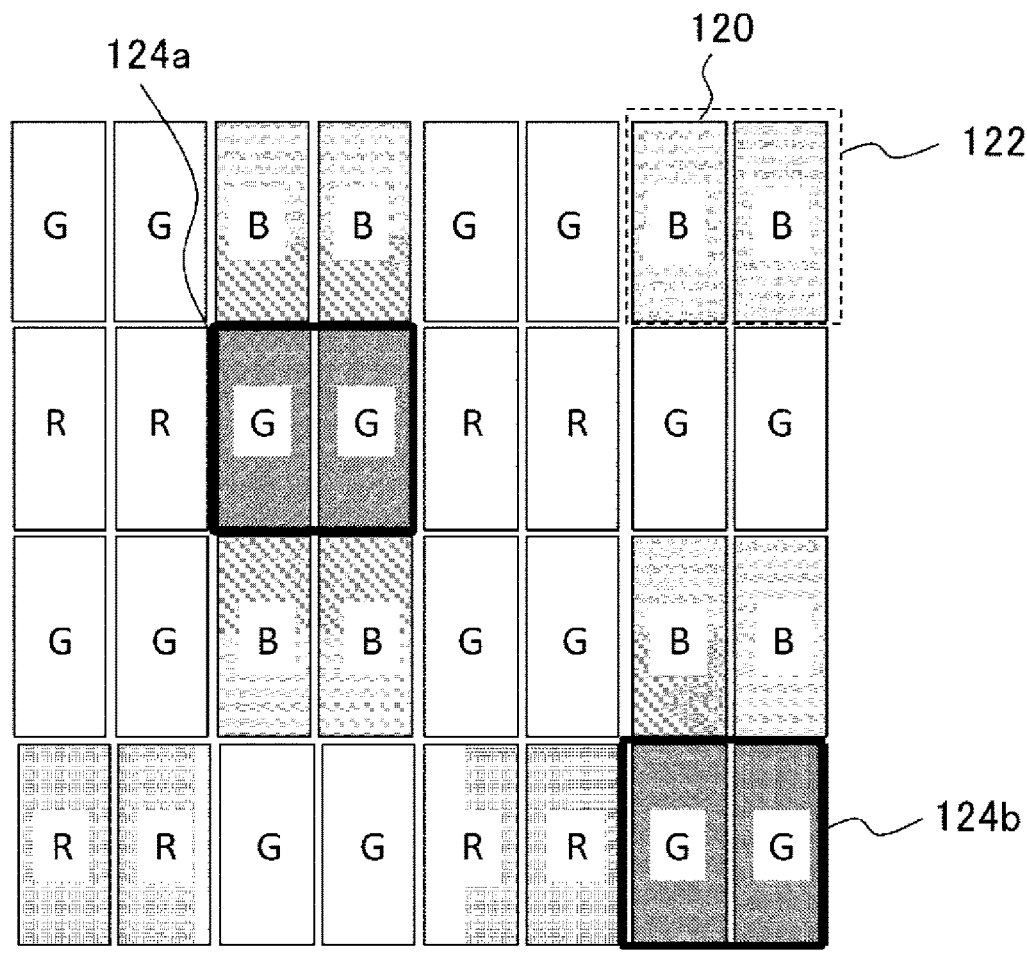
FIG. 3 is a diagram illustrating a pixel arrangement in an imaging element of the present embodiment.

FIG. 3 illustrates a pixel arrangement in the imaging element 20. This figure schematically illustrates a combination of layers when some regions of the imaging element 20 are viewed from above, with each vertically long rectangle representing a photodiode (e.g., photodiode 120). A pair of left and right photodiodes correspond to a pixel (e.g., pixel 122). Also, color filters in the color filter layer 114 are arranged in Bayer pattern, and one of red, green, and blue light beams is detected in each pixel. In FIG. 3, these pixels are denoted by letters "R," "G," and "B," respectively.

Also, a polarizer is provided in each of pixels 124*a* and 124*b* that are depicted with bold frames. Bold diagonal lines in the pixels 124*a* and 124*b* represent wires included in the polarizers. That is, the pixels 124*a* and 124*b* include polarizers that differ in principal axis angle. Although FIG. 3 illustrates two types of polarizers whose principal axis angles are orthogonal to each other, four types of polarizers having principal axis angles spaced at intervals of 45 degrees are further provided by using another pixel.

Each of the polarizers allows passage of polarization components orthogonal to the direction of wires. This allows the photodiodes provided in an underlying layer to output electric charge representing luminance of the polarization components in four directions spaced at intervals of 45 degrees. In the case where only the luminance of polarization is to be acquired from the pixel in question, the detected values of two photodiodes provided in a pixel may be added up. In Bayer pattern, the highest pixel density is assigned to green (G). In this example, therefore, polarizers are provided in the green pixels.

This makes it possible to bring the pixels with a polarizer relatively close to each other and acquire luminance of polarization of the same color in a plurality of directions at high resolution. Separation of this for each polarization direction and interpolation thereof provides polarization images in four directions. It is possible to acquire normal vectors of the subject surface by using the polarization images in question. The normal vectors represent inclinations of minute regions of the subject surface. Therefore, the distance values of feature points acquired on the basis of phase difference can be interpolated by using the normal vectors. Images having the same viewpoint shot with the same imaging apparatus 12 provides distance values and normal vectors at the same time through phase difference, thus realizing accurate interpolation with no need for positioning and other processes.

It should be noted that in the case where a color image is not used for image display or for other purposes, the color filter layer 114 may be removed from the pixel 110. In this case, a luminance image, a distance image, and a normal image can be acquired. Alternatively, cyan, magenta, and other dye-based filters may be used as color filters. Also, the arrangement illustrated in FIG. 3 is merely an illustration, there is no intention to limit the pixel arrangement of the present embodiment thereto. For example, the density of pixels with a polarizer may be increased further. Alternatively, a polarizer may be provided in each of all the pixels.

Figure 4:
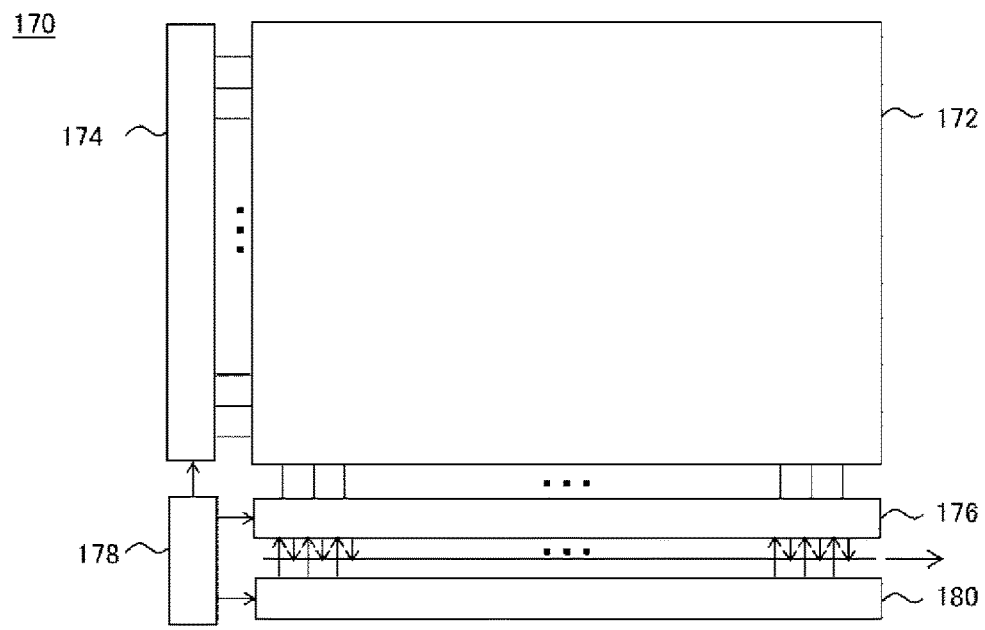
FIG. 4 is a diagram illustrating a schematic structure of an image sensor in the present embodiment.

FIG. 4 illustrates a schematic structure of an image sensor in the present embodiment. An image sensor 170 includes a pixel section 172 and a row scanning section 174, a horizontal selection section 176, a column scanning section 180, and a control section 178 as peripheral circuitry. The pixel section 172 includes pixels arranged in matrix pattern as illustrated in FIG. 2.

Each photodiode in the photoelectric conversion layer 118 is connected to the row scanning section 174 for each row and to the horizontal selection section 176 and the column scanning section 180 for each column. The row scanning section 174 includes shift registers, address decoders, and so on and drives the respective pixels on a row-by-row basis. A signal output from the pixel selected and scanned by the row scanning section 174 is supplied to the horizontal selection section 176. The horizontal selection section 176 includes amplifiers and horizontal selection switches.

The column scanning section 180 includes shift registers, address decoders, and so on and drives the respective horizontal selection switches of the horizontal selection section 176 in turn while at the same time operating these switches. Each of the signals from the respective pixels supplied to the horizontal selection section 176 as a result of selection and scanning by the column scanning section 180 is externally output. The control section 178 generates timing signals, controlling timings at which to drive the horizontal selection section 176, the column scanning section 180, and so on.

In a mode of the present embodiment, some pixels have a polarizer whereas other pixels do not have one. In this case, the pixels with a polarizer reflect part of incident light. As a result, the intensity of light that reaches the photodiodes is lower than in the pixels with no polarizer. Also, more information is acquired by the pixels with a polarizer than those with no polarizer. In consideration of all these factors, peripheral circuitry as that illustrated may be divided into two depending on whether there is a polarizer so that data readout timings and intervals between readouts can be controlled independently.

For example, the same level of luminance is achieved across the image plane by reducing a frame rate of the pixels including a polarizer and lengthening a charge accumulation time longer than for other pixels. This makes it possible to treat the image as a whole uniformly irrespective of whether a polarizer is provided. Alternatively, conversely to the above, the frame rate of the pixels including a polarizer may be increased. In this case, the sensitivity for detecting a motion of the subject's plane can be increased by using a luminance distribution of polarization output at a high rate and finding a normal vector distribution frequently. The manner in which data readout timings are to be controlled may be determined, for example, in accordance with the detection sensitivity required of processing content at subsequent stages.

Figure 5:
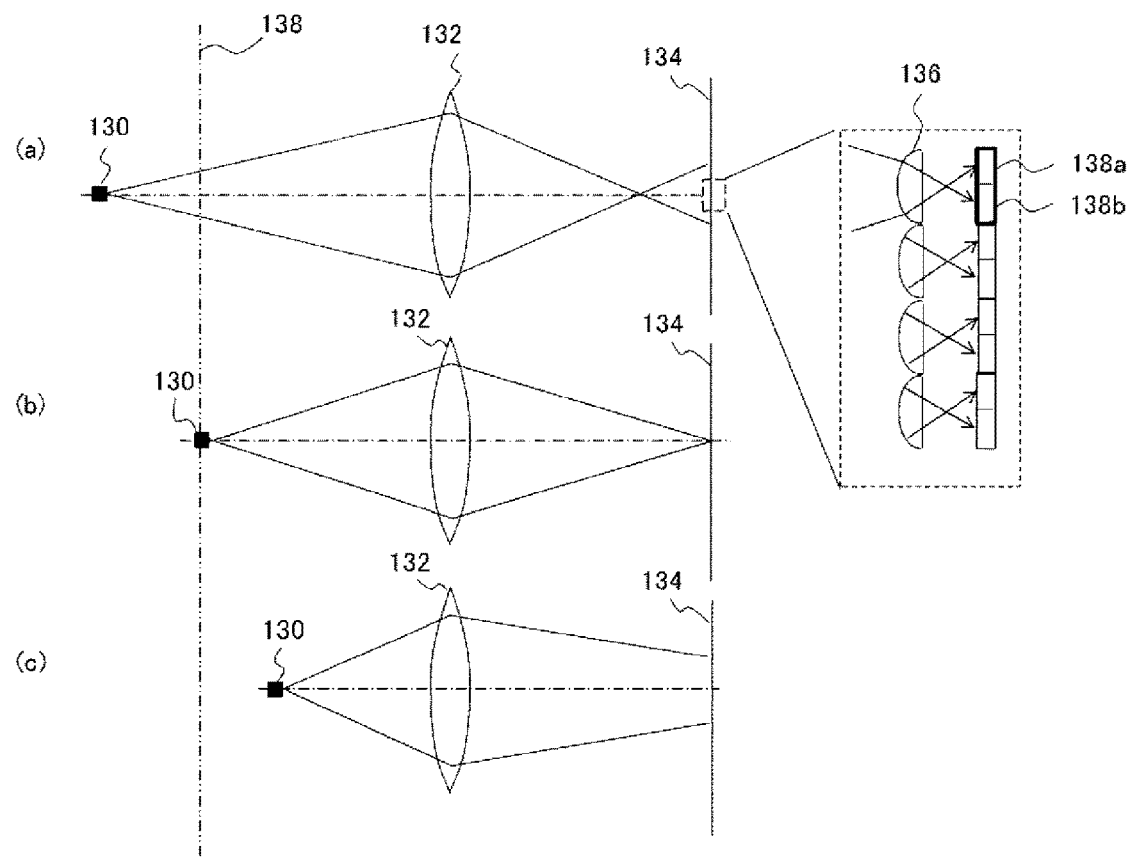
FIG. 5 depicts diagrams for describing a principle behind acquiring distance information through a phase difference.

FIG. 5 depicts diagrams for describing a principle behind acquiring distance information through phase difference. These figures illustrate a route through which light from a subject 130 enters an imaging surface 134 of the imaging element 20 by way of a focusing lens 132 of the image forming optics 14 as viewed from above the imaging space. We assume that the distance from the imaging surface 134 to the subject 130 is different between states (a), (b), and (c) and that the subject 130 is located at an in-focus position, i.e., at a focused surface 138, in state (b).

That is, light emitted from a point on the subject 130 forms an image at one point on the imaging surface 134 in state (b). Therefore, a point on the subject corresponds to a pixel, and even if two photodiodes are provided in a pixel, a luminous flux detected by these photodiodes originates from approximately the same point on the subject 130. On the other hand, if the subject 130 is located at the back of the focused surface 138 as in state (a) or at the front of the focused surface 138 as in state (c), the position where light forms an image deviates from the imaging surface 134.

As a result, misalignment occurs in a pixel that captures a luminous flux depending on through which of two parts, left and right (top and bottom in FIG. 5), of the focusing lens 132 the luminous flux passes. As illustrated in an enlarged manner on the right in FIG. 5, of the light beams passing through the microlens 136, those light beams coming from an upper side in FIG. 5 are detected by a photodiode 138b at the bottom in FIG. 5 and those light beams coming from a lower side in FIG. 5 are detected by a photodiode 138a at the top in FIG. 5. In the description given below, of the photodiode pair, the photodiode on the left as viewed from the imaging surface (e.g., photodiode 138a) will be also referred to as a left photodiode, and the photodiode on the right as viewed from the imaging surface (e.g., photodiode 138b) will be also referred to as a right photodiode.

As a result, misalignment proportional to misalignment in pixels for capturing luminous flux occurs between the image acquired by extracting only the luminance detected by the left photodiode in each pixel and the image acquired by extracting only the luminance detected by the right photodiode in each pixel. The amount of misalignment in question depends on the distance between the subject 130 and the focused surface 138. Also, the direction of misalignment is reversed between when the subject 130 is closer to or farther from the imaging surface 134 than the focused surface 138. Hereinafter, two images having, as pixel values, luminances detected by the left and right photodiodes, respectively, will be referred to as "phase difference images," and the amount of misalignment in the silhouette of the same subject in the two images will be referred to as "phase difference."

Figure 6:
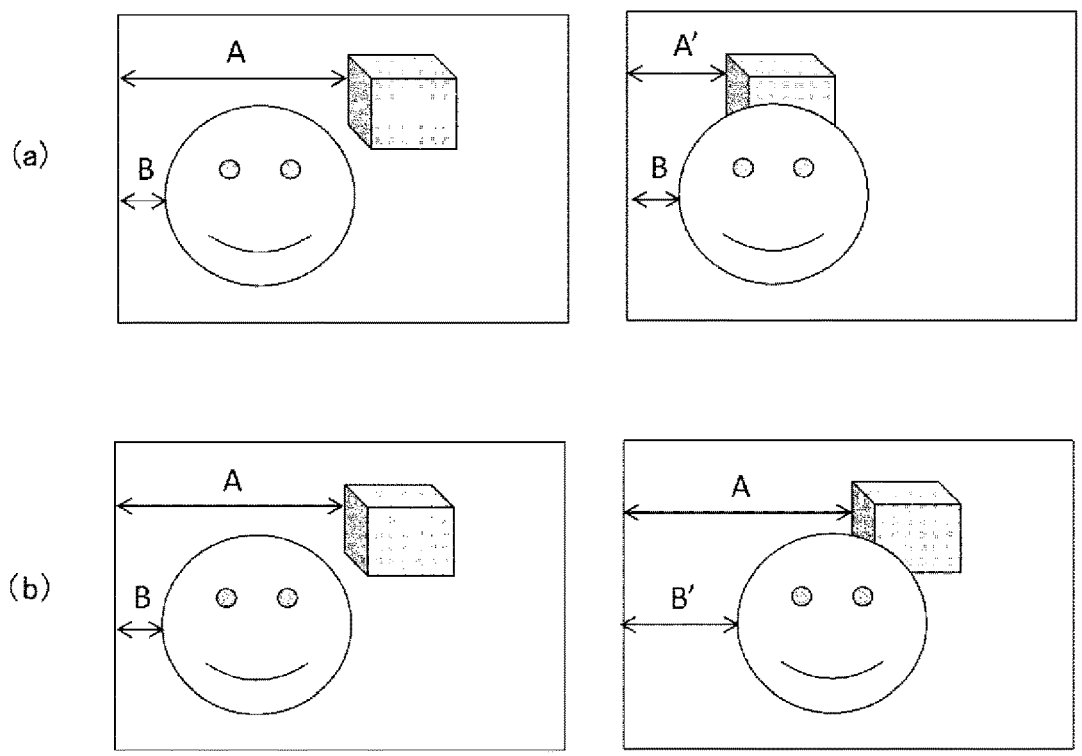
FIG. 6 depicts diagrams for describing a relationship between an acquired image and a focal distance in the present embodiment.

FIG. 6 depicts diagrams for describing a relationship between an image and a focal distance acquired in the present embodiment. These figures schematically illustrate phase difference images when a space in which a face and a cube exist is shot, and of the left and right images, the left ones have been detected by the left photodiode, and the right ones have been detected by the right photodiode. Of these, the face is in focus in the images (a). In this case, the silhouette of a face is located at a distance B from the left edge in both of the phase difference images, and as a result, no phase difference is present. On the other hand, a phase difference of (A'-A) is present in the silhouette of a cube. The cube is in focus in the images (b). In this case, the cube silhouette is located at a distance A from the left edge in both of the phase difference images, and as a result, no phase difference is present. On the other hand, a phase difference of B'-B is present in the face silhouette.

Figure 7:
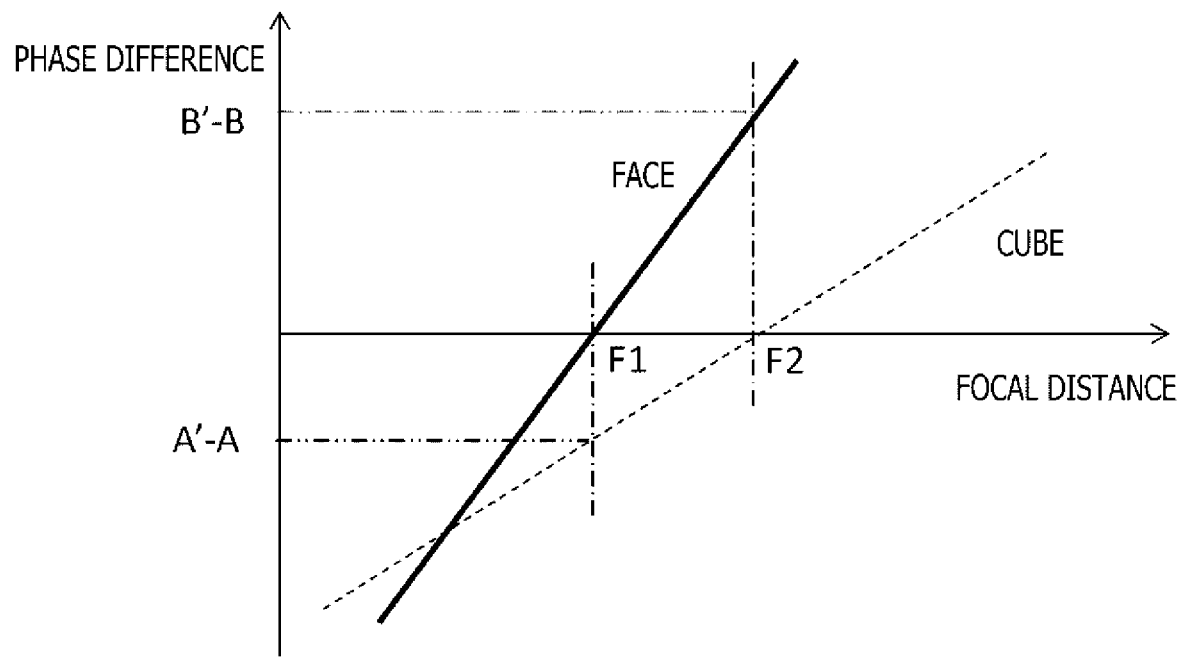
FIG. 7 is a diagram schematically illustrating a relationship between the focal distance and a phase difference in the case depicted in FIG. 6.

As described above, because the direction of misalignment is reversed between when the subject is closer or farther than the focal distance, phase difference can take on a negative value. FIG. 7 schematically illustrates a relationship between the focal distance and the phase difference in the case depicted in FIG. 6. The solid line and the broken line in the figure represent the phase difference in the face and the phase difference in the cube, respectively, as a change relative to the focal distance. It should be noted that the actual phase difference characteristic is not limited to that illustrated due to various factors related to optics. When the focal distance is F1, there is no phase difference in the face as illustrated in (a) of FIG. 6, and a phase difference of A'-A is present in the cube. When the focal distance is F2, there is no phase difference in the cube as illustrated in (b) of FIG. 6, and a phase difference of B'-B is present in the face.

That is, when the distance to the subject is fixed, the phase difference is uniquely determined by the focal distance. In other words, when the focal distance and the phase difference are determined, it is possible to identify the distance to the subject. The focal distance can be similarly acquired with a focusing function of an ordinary imaging apparatus. Also, as for the relationship between the distance from the focal distance (focused surface) to the subject and the phase difference, a relationship experimentally acquired from an actual shot image of the subject at a known distance is prepared in advance as a table. This makes it possible to calculate the distance from the imaging surface to the subject by finding the distance from the focused surface on the basis of the observed phase difference and further adding the focal distance.

A description will be given next of a technique for acquiring normal vectors from polarization images. Research has been conducted on technologies for acquiring various pieces of information regarding a subject by taking advantage of polarization component images in a plurality of directions. Methods of finding normal vectors of a subject surface is disclosed, for example, in Gary Atkinson and Edwin R. Hancock, "Recovery of Surface Orientation from Diffuse Polarization," IEEE Transactions on Image Processing, June 2006, 15(6), pp. 1653-1664, Japanese Patent Laid-Open No. 2009-58533, and so on, and these methods may be adopted in the present embodiment as appropriate. An outline will be given below.

First, the luminance of light observed via a polarizer changes with respect to a principal axis angle $\theta_{pol}$ of the polarizer as indicated by the following formula:

[Math. 1]

$$I = \frac{I_{max} + I_{min}}{2} + \frac{I_{max} - I_{min}}{2}\cos(2(\theta_{pol} - \varphi)) \qquad \text{(Formula 1)}$$

Here, $I_{max}$ and $I_{min}$ are the maximum and minimum values of the luminance observed, respectively, and $\phi$ is the phase of polarization. In the case where polarization images are acquired for the four principal axis angles $\theta_{pol}$ as described above, the luminance I of the pixel at the same position satisfies Formula 1 for each of the principal axis angles $\theta_{pol}$. Therefore, $I_{max}$, $I_{min}$, and $\phi$ can be found by approximating curves passing through these coordinates (I, $\theta_{pol}$) to a cosine function by using the least squares method or other technique. A degree of polarization ρ can be found with the following formula by using $I_{max}$ and $I_{min}$ found as described above.

[Math. 2]

$$\rho = \frac{I_{max} - I_{min}}{I_{max} + I_{min}} \quad \text{(Formula 2)}$$

A normal of a target surface can be expressed by an azimuth α that represents the angle of an incident surface of light (outgoing surface in the case of diffuse reflection) and a zenith angle θ that represents the angle on the surface in question. Also, according to a dichroic reflection model, reflected light spectra are represented by a linear sum of mirror reflection spectra and diffuse reflection spectra. Here, mirror reflection is light normally reflected by the surface of an object, and diffuse reflection is light scattered by pigment particles included in the object. The above azimuth α is the principal axis angle that gives the minimum luminance $I_{min}$ in Formula 1 in the case of mirror reflection and the principal axis angle that gives the maximum luminance $I_{max}$ in Formula 1 in the case of diffuse reflection.

The zenith angle θ has the following relationships with a degree of polarization $\rho_s$ in the case of mirror reflection and a degree of polarization $\rho_d$ in the case of diffuse reflection, respectively:

[Math. 3]

$$\rho_s = \frac{2\sin^2\theta\sqrt{n^2 - \sin^2\theta}}{n^2 - \sin^2\theta - n^2\sin^2\theta + 2\sin^4\theta} \quad \text{(Formula 3)}$$

$$\rho_d = \frac{(n - 1/n)^2 \sin^2\theta}{2 + 2n^2 - (n + 1/n)^2\sin^2\theta + 4\cos\theta\sqrt{n^2 - \sin^2\theta}}$$

Here, n is the refractive index of the target. The zenith angle θ can be acquired by substituting the degree of polarization ρ acquired by Formula 2 into $\rho_s$ or $\rho_d$ in Formula 3. A normal vector ($p_x$, $p_y$, $p_z$) can be acquired by the azimuth α and the zenith angle θ as follows:

[Math. 4]

$$\begin{pmatrix} p_x \\ p_y \\ p_z \end{pmatrix} = \begin{pmatrix} \cos\alpha\cos\theta \\ \sin\alpha\cos\theta \\ \sin\theta \end{pmatrix} \quad \text{(Formula 4)}$$

As described above, the normal vector of the target appearing in the pixel in question is found from the relationship between the luminance I represented by each pixel of the polarization image and the principal axis angles $\theta_{pol}$ of the polarizer, thus providing a normal vector distribution as an entire silhouette. For example, in a mode where the target can be limited, for example, to a game controller, an appropriate model of the two models, mirror reflection and diffuse reflection models, is adopted, thus allowing a normal to be found with higher accuracy. On the other hand, a variety of techniques have been proposed to separate mirror reflection and diffuse reflection. Therefore, a normal may be found in a stricter manner by using such techniques.

Figure 8:
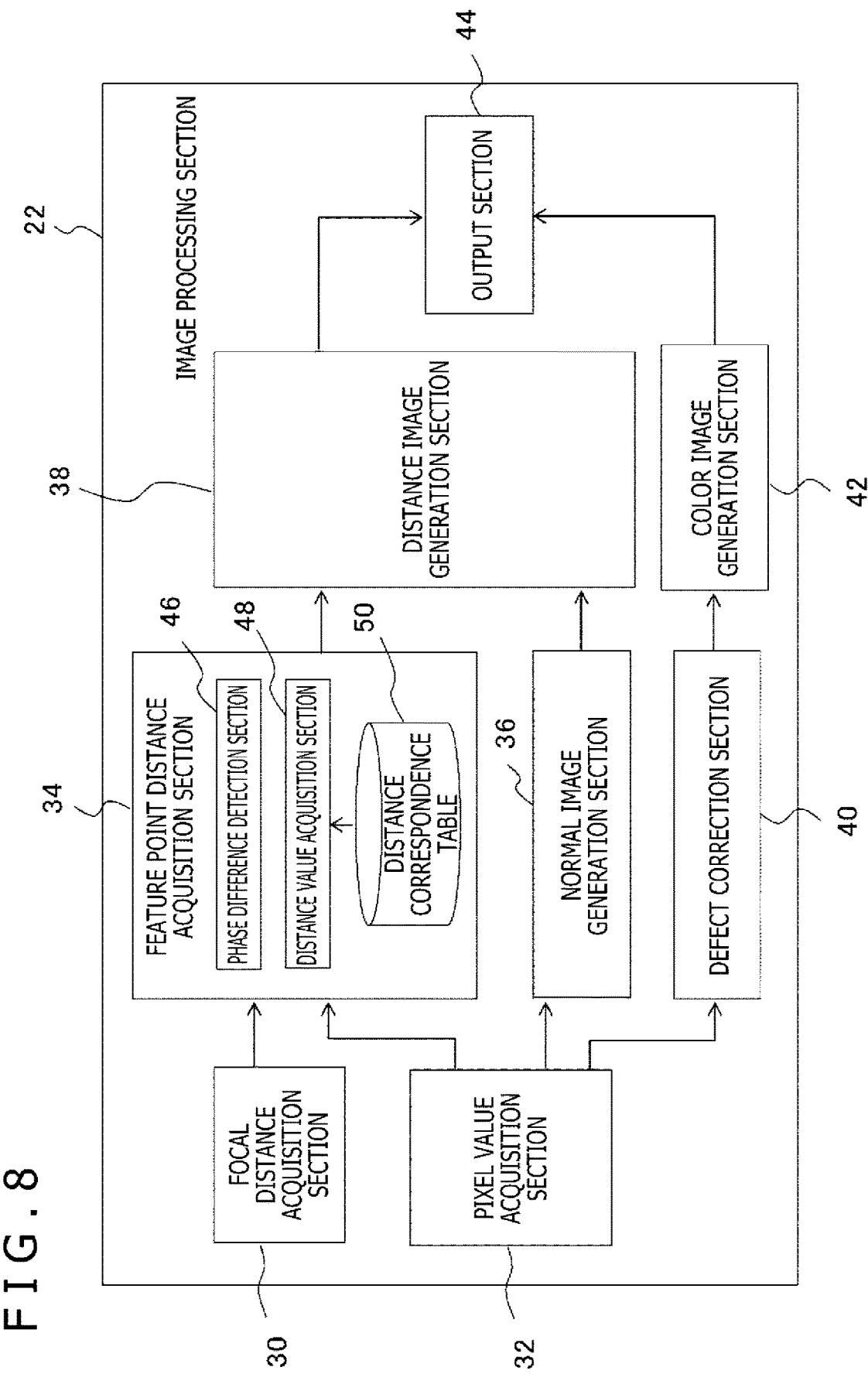
FIG. 8 is a diagram illustrating functional blocks of an image processing section in the present embodiment.

FIG. 8 illustrates functional blocks of the image processing section 22 in the present embodiment. Each of the functional blocks illustrated in this figure and FIGS. 17 and 20 described later can be realized, in terms of hardware, by a component such as an imaging element, various arithmetic circuits, a microprocessor, and a buffer memory, and in terms of software, by programs stored in a memory. Therefore, it is understood by those skilled in the art that these functional blocks can be realized in a various manners by hardware alone, software alone, or a combination thereof and are not limited to any one of them.

The image processing section 22 includes a pixel value acquisition section 32, a focal distance acquisition section 30, a feature point distance acquisition section 34, a normal image generation section 36, a distance image generation section 38, a defect correction section 40, a color image generation section 42, and an output section 44. The pixel value acquisition section 32 acquires 2D luminance data from the imaging element 20 and performs given preprocessing. The focal distance acquisition section 30 acquires an actual focal distance. The feature point distance acquisition section 34 generates a distance image on the basis of phase difference. The normal image generation section 36 generates a normal image from polarization luminance in a plurality of directions. The distance image generation section 38 generates a distance image by interpolating a distance value based on phase difference with a normal vector. The defect correction section 40 corrects a pixel value defect. The color image generation section 42 generates a color image by a demosaicing process. The output section 44 outputs distance image and color image data.

The pixel value acquisition section 32 acquires a luminance signal, detected by the imaging element 20, as 2D data and performs given preprocessing such as analog-to-digital (A/D) conversion and clamping process. The focal distance acquisition section 30 reads out a focal distance, acquired by the focusing function or other function incorporated in the imaging apparatus 2, a function not illustrated, from the memory. In an environment where the focal distance is adjustable, each time the focal distance changes, the data is read out. In the apparatus where the focal distance is fixed, the setting thereof is acquired initially.

The feature point distance acquisition section 34 includes a phase difference detection section 46, a distance value acquisition section 48, and a distance correspondence table 50. The phase difference detection section 46 generates a phase difference image by separating, of the pixel values acquired by the pixel value acquisition section 32, those pixel values detected by the left and right photodiodes. At this time, all the pixels in Bayer pattern may be treated as target pixels. Alternatively, only the green pixels may be treated as target pixels. Then, feature points of the two are extracted, and a phase difference is found for each feature point by identifying a position representing the same feature point in the subject.

The distance correspondence table 50 stores a distance correspondence table associating the distance from the focused surface with the phase difference. The distance value acquisition section 48 acquires the distance value corresponding to the phase difference by referring to the distance correspondence table on the basis of the phase difference acquired by the phase difference detection section 46. Then, the distance value acquisition section 48 acquires the absolute value of the distance from the imaging surface for each feature point by adding the distance value to the focal distance acquired from the focal distance acquisition section 30.

The normal image generation section 36 acquires, of the pixel values acquired by the pixel value acquisition section 32, the values of the pixels having a polarizer, and further, generates polarization images in a plurality of directions by separating and interpolating the pixel values for each principal axis angle. At this time, the detection values of the two photodiodes provided in one pixel are summed up for use as a single pixel value. Also, polarization luminances in a plurality of directions are acquired for the same position on the image plane by interpolating the polarization luminance in each direction. Then, a normal vector is calculated by using Formulas 1 to 4 on the basis of a change of the polarization luminance relative to the direction.

The normal image generation section 36 generates a normal image having three factors of normal vector acquired for each pixel. This image can basically have the same resolution as a shot image. On the other hand, a normal image may be generated with a lower resolution than the shot image depending on resolution required of the normal vector and the distance image at subsequent stages.

The distance image generation section 38 generates a distance image representing distances on the subject surface as pixel values by interpolating the distance values for the feature points generated by the feature point distance acquisition section 34 by using the normal images generated by the normal image generation section 36. That is, although capable of acquiring distance values for easy-to-identify feature points, which may find the phase difference, such as silhouette outlines and surface patterns, the feature point distance acquisition section 34 has difficulty in calculating the distance of a region whose feature points are difficult to be readily extracted such as surface of a monochromatic and smooth object.

On the other hand, the normal image generation section 36 can acquire, in a detailed manner, an inclination of an object surface for each minute region. Therefore, it is possible to find a distance with a similar resolution to that with which a normal vector was acquired by using the distance values at the feature points acquired by the feature point distance acquisition section 34 as starting points and giving, in turn, an inclination based on the normal vector acquired by the normal image generation section 36. The defect correction section 40 corrects, of the pixel values acquired by the pixel value acquisition section 32, those pixel values of the pixels with a polarizer.

The pixels with a polarizer reflect polarization components in the same direction as the principal axis angle of the polarizer. Therefore, light reaching the photodiodes is lower in intensity than light incident on the imaging surface. Therefore, the luminances of the pixels in question are corrected in such a manner as to provide luminance levels comparable to those of the surrounding pixels, thus preventing some pixels of a color image from becoming black dots. As a correction process, the pixel luminances may be interpolated with surrounding pixel values. Alternatively, the percentage of decline in amount of light attributable to the polarizer may be found, for example, experimentally in advance so that the appropriate pixel value is multiplied by a constant based on the percentage of decline. It should be noted that the defect correction section 40 also sums up the detection values of a pair of photodiodes and treats the values as a single pixel value.

The color image generation section 42 generates a color image each of whose pixels has three attributes of color by performing a demosaicing process on the image that has undergone the defect correction. That is, the color image generation section 42 ensures that all pixels have three attributes by interpolating, on a color-by-color basis, the pixel values acquired in Bayer pattern as illustrated in FIG. 3. An ordinary demosaicing technique can be used for this process. The output section 44 acquires at least distance image data generated by the distance image generation section 38 and color image data generated by the color image generation section 42 and sequentially outputs these pieces of data to an external apparatus.

Alternatively, the output section 44 may temporarily store these pieces of data in a memory or a recording medium so that the data can be sent to an external apparatus at a proper timing, for example, in response to user operation or be taken out by the user. In the present embodiment, color and distance images can be acquired at the same time with comparable resolutions, thus allowing for various kinds of information processing to be performed with accuracy by using these images. For example, the position and color of a subject in a 3D space are found. Therefore, by arranging these temporarily in a virtual space, it is possible to reconstruct a display image to match with the viewpoint of the user wearing a head-mounted display. At this time, virtual reality and enhanced reality can be realized by generating an image for left viewpoint and another image for right viewpoint and displaying the images respectively in left and right regions obtained by dividing the display screen of the head-mounted display into two parts.

It should be noted that the output section 44 may further output the normal image generated by the normal image generation section 36. Normal information can be used for motion detection because this information represents the change in subject's posture with higher sensitivity than the subject's silhouette itself. It should be noted that if the image processing section 22 of the imaging apparatus 12 can generate a distance image together with a color image as illustrated, it is possible to keep, to a minimum, burdens on an information processing apparatus that uses such images for performing various processes and keep, to a minimum, power consumption of the information processing apparatus.

On the other hand, at least one of the distance image generation section 38, the feature point distance acquisition section 34, and the normal image generation section 36 may be provided in an information processing apparatus other than the imaging apparatus 12. Alternatively, a logic circuit having at least some of the functions of those as illustrated may be provided in the underlying layer of the pixel arrangement to provide a stacked image sensor. As a result, many image processing tasks are completed within the image sensor, thus speeding up processing and eliminating the need for a large-scale arithmetic unit.

Figure 9:
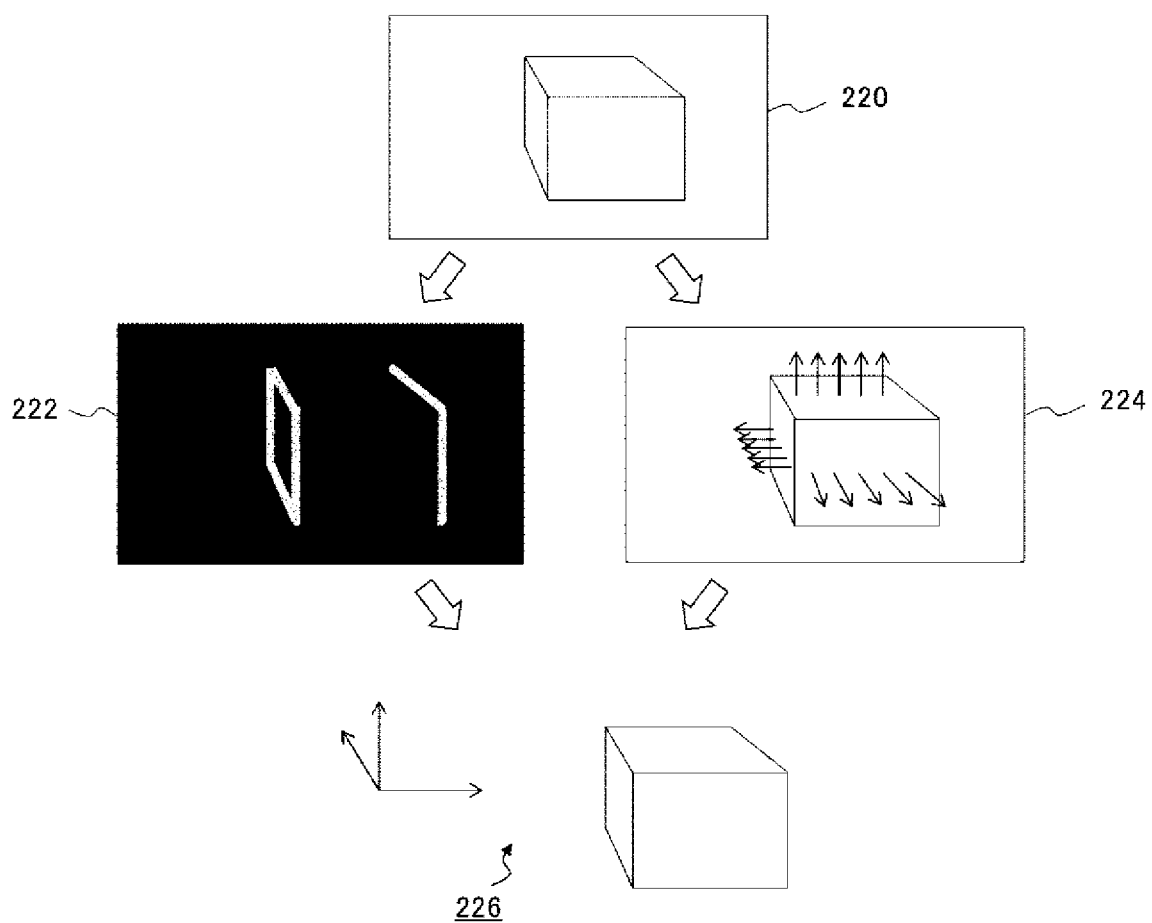
FIG. 9 is a diagram schematically illustrating changes made to a shot image by the image processing section in the present embodiment.

FIG. 9 schematically illustrates changes made to a shot image by the image processing section 22. First, the pixel value acquisition section 32 acquires shot image data like an image 220. In the example illustrated, a cube appears as a subject. Acquired data, to be precise, includes information regarding luminance of natural light or polarization detected by the left and right photodiodes. The feature point distance acquisition section 34 acquires phase differences of the feature points as described above and uses the phase differences and focal distances to generate data 222 of distance values to the feature points.

The data 222 illustrated is represented in distance image format in which the smaller the distance value, the higher the luminance and in which the lowest luminance is assigned to locations with no distance value. In this case, of the cube, a subject, edge portions with a high luminance gradient can be extracted as feature points, and further, a distance value can be acquired only for those portions whose phase difference is found in the phase difference image. If a pair of photodiodes are arranged, one on the left and another on the right, in a pixel region as illustrated in FIG. 3, phase differences manifest themselves in the horizontal direction of the image plane. This makes it impossible to identify phase differences accurately for horizontal edges as illustrated in the data 222, thus resulting in undefined distance values.

On the other hand, the normal image generation section 36 generates a normal image 224 by using polarization images in a plurality of directions. Although only part of a normal vector distribution on the cube surface is illustrated by arrows, normal vectors can be actually found on a pixel-by-pixel basis. The distance image generation section 38 applies, on a pixel-by-pixel basis, a surface inclination based on a normal vector by using the edge portion distances acquired by the phase-difference-based distance value data 222 as starting points. As a result, not only the fact that a flat surface is present between the edges in the data 222 but also distance values of the surface including the horizontal edge portions are found.

This makes it possible to acquire position information 226 in a world coordinate system for visible portions of a cube surface as a shot image. The distance image generation section 38 may generate information regarding position coordinates on the subject surface in such a 3D space or generate a distance image representing distance values on the image plane.

Figure 10:
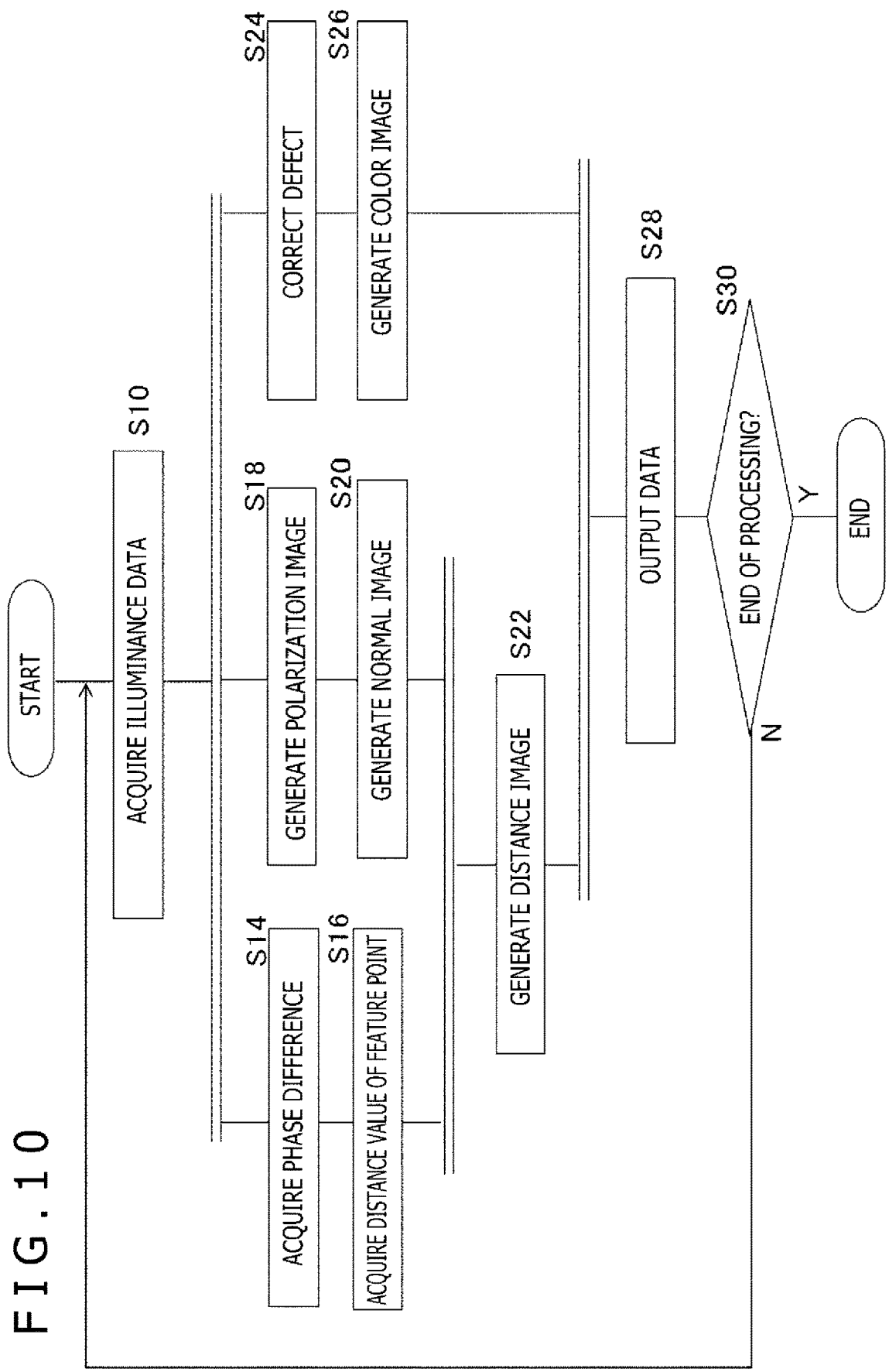
FIG. 10 is a flowchart illustrating a processing procedure for the image processing section to generate various pieces of data from a shot image and outputting the data.

A description will be given next of operation of the image processing section 22 that can be realized by the components described so far. FIG. 10 is a flowchart illustrating a processing procedure for the image processing section 22 to generate various pieces of data from a shot image and outputting the data. First, the pixel value acquisition section 32 acquires luminance data detected by each of the photodiodes from the imaging element 20 (S10). The acquired luminance data is supplied to the feature point distance acquisition section 34, the normal image generation section 36, and the defect correction section 40.

The feature point distance acquisition section 34 generates a phase difference image by separating the luminances detected by the left and right photodiodes and acquires a phase difference by achieving correspondence between feature points (S14). Then, the feature point distance acquisition section 34 identifies a distance value for pixels included in the feature points on the basis of the phase difference and the focal distance (S16). The normal image generation section 36 generates polarization images in a plurality of directions by extracting the values of the pixels detecting polarization and separating and interpolating the pixel values for each principal axis angle of the polarizer (S18). Then, the normal image generation section 36 calculates a normal vector for each pixel or for each larger unit by acquiring direction dependence of polarization luminance at the same position and generates the normal image (S20).

The distance image generation section 38 generates a distance image whose distance value has been interpolated by finding a distance value using the normal image for locations whose distance value cannot be found through phase difference (S22). On the other hand, the defect correction section 40 performs defect correction that amplifies the luminance levels of the pixels detecting polarizations to the same level as other pixels (S24). The color image generation section 42 generates a color image by performing a demosaicing process on the corrected image in Bayer pattern (S26).

The output section 44 sequentially outputs the color image and distance image data to an external apparatus, a memory, or other location (S28). At this time, normal image data may also be output at the same time. The data to be output may be switched in response to a request from the output destination apparatus. If there is no need to terminate the shooting or data output through user operation, the processes from S10 to S28 are repeated on an image-frame-by-image-frame basis (N in S30). If there is a need to terminate the process, all the processes are terminated (Y in S30).

It should be noted that when the distance image generation section 38 generates a distance image in S22, distance images generated for a plurality (given number) of image frames may be accumulated so that data obtained by averaging the accumulated distance images is used as a distance image at that point in time and output at time intervals corresponding to the number of image frames in question. This contributes to a reduced ratio of noise component included in the distance image generated from one image frame, thus allowing for output of a highly accurate distance image. As for the number of frames of a distance image to be accumulated, an optimal number is found in advance experimentally or by other means in consideration of required accuracy, time resolution, and other factors. Alternatively, the number of frames may be changed adaptively in accordance with the luminance level of an actual shot image.

Figure 11:
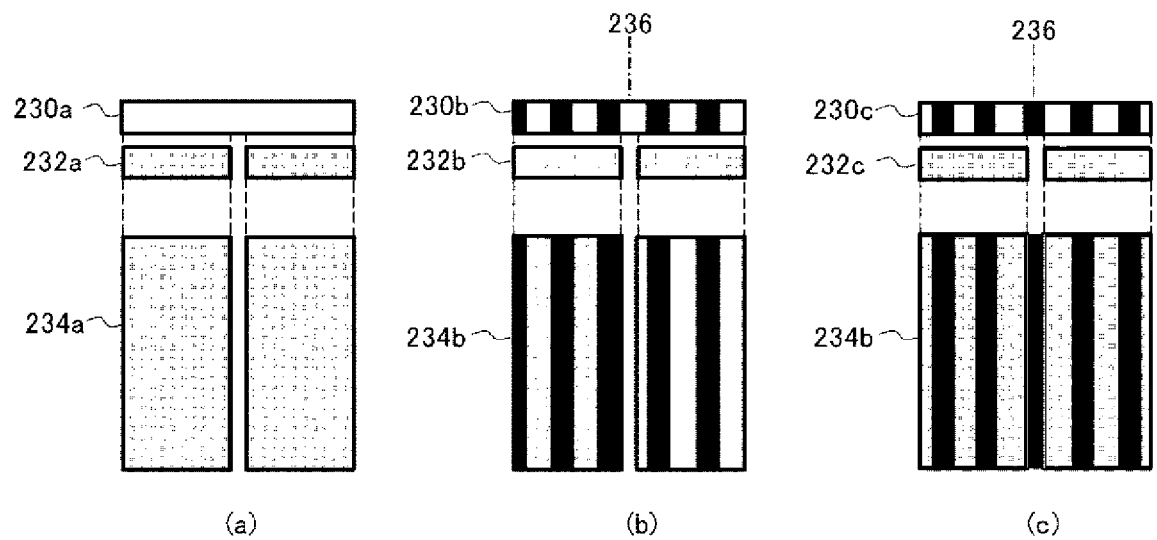
FIG. 11 depicts diagrams for describing a positional relationship between polarizers and photodiodes in the present embodiment.

The imaging element of the present embodiment includes a structure in which a polarizer is provided in an overlying layer of a pair of photodiodes. The detection of comparable luminance levels with a pairs of photodiodes is a precondition to finding a phase difference with accuracy. However, that balance may be lost depending on the positional relationship between the polarizer and the photodiodes. FIG. 11 depicts diagrams for describing a positional relationship between polarizers and photodiodes. These figures illustrate cross sections of stacked structures of polarizer layers 230a, 230b, and 230c and photodiode pairs 232a, 232b, and 232c and positional relationships 234a, 234b, and 234c thereof as viewed from above.

First, in the case of a pixel with no polarizer in the polarizer layer 230a as illustrated in (a), incident light reaches the photodiodes with no loss. Therefore, the luminance levels detected by the photodiode pair are comparable. In the pixels with a polarizer in the polarizer layers 230b and 230c as illustrated in (b) and (c), light that successfully reaches the photodiodes is approximately half the incident light due to reflection by the polarizer wires. When a color image is generated by using the sum of the detection values of the two photodiodes as a pixel value, it is possible to achieve a luminance level comparable to that of the surrounding pixels by multiplication by a given value or interpolation with detection values of the surrounding pixels.

On the other hand, if a polarizer wire arrangement is asymmetrical with respect to a vertical centerline 236 of the pixels as illustrated in (b), the areas coated with wires facing the photodiode pair 232b are different in size. This results in a difference in detection sensitivity between the pair of photodiodes. If a phase difference image is generated that includes such pixels, there is a possibility that a phase difference may not be detected with accuracy. Evening out levels by multiplying the detection value of the photodiode with lower sensitivity by a given value based on the wire area ratio would be a possible option. However, noise is also amplified. As a result, the phase difference accuracy may not always improve.

Figure 12:
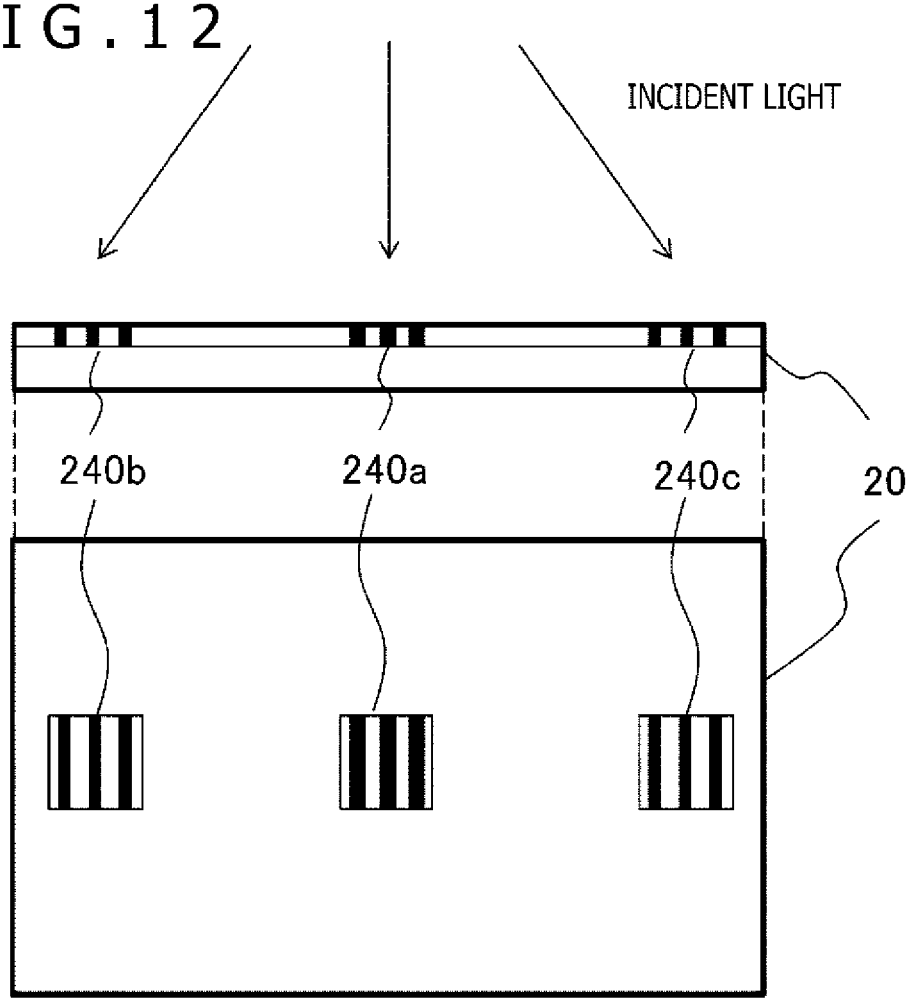
FIG. 12 is a diagram schematically illustrating a polarizer wire arrangement at different positions on an imaging surface in the present embodiment.

Therefore, it is desirable to arrange polarizer wires in a symmetrical manner with respect to the vertical centerline 236 of the pixels as illustrated in (c). This contributes to reduced impact of the polarizer on the luminance level detected by the photodiodes in one pixel. The difference in light detection sensitivity caused by the polarizer also takes place due to pixel positions across the imaging element 20. FIG. 12 schematically illustrates a polarizer wire arrangement at different positions on the imaging surface.

As illustrated in the side view at the top, light is incident approximately perpendicularly in a pixel 240a near the center of the imaging element 20. On the other hand, the larger the distance from the center, the larger the incident angle (chief ray angle (CRA)). For this reason, the farther the portions are from the center, the greater the effective shielding effect of the polarizer wires, thus making it less likely for light to enter into these portions and deteriorating the detection sensitivity as compared to the central portions. This results, in addition to the above balance in luminance level of the phase difference image, in a distribution across the plane in a color image generated by correcting a normal image using polarization and correcting the polarization luminance.

Preferably, therefore, the detection sensitivities of the photodiodes are evened out by varying the polarizer shape depending on the position on the imaging element 20. In the example illustrated, the loss of incident light is reduced by reducing widths of the wires of the polarizers of the pixels 240b and 240c in the surrounding portions as compared to that of the wires of the pixel 240a in the central portions. Actually, the wire width is gradually reduced with distance from the center portion. Alternatively, the wire height may be reduced or both the wire width and height may be changed with distance from the center.

Alternatively, the wire arrangement as a whole may be moved only minutely in a linearly symmetrical manner with respect to the centerline. For example, the entire wire arrangement of the pixel 240b at left on the imaging element 20 is moved to the left, and the entire wire arrangement of the pixel 240c at right on the imaging element 20 is moved to the right. This also provides a larger amount of incident light with angle. The wire width, height, and amount of movement of the wire arrangement are optimized to provide a minimum distribution across the plane in an actual shot image. At this time, the difference in sensitivity between the pair of photodiodes is minimized as described in FIG. 11.

Figure 13:
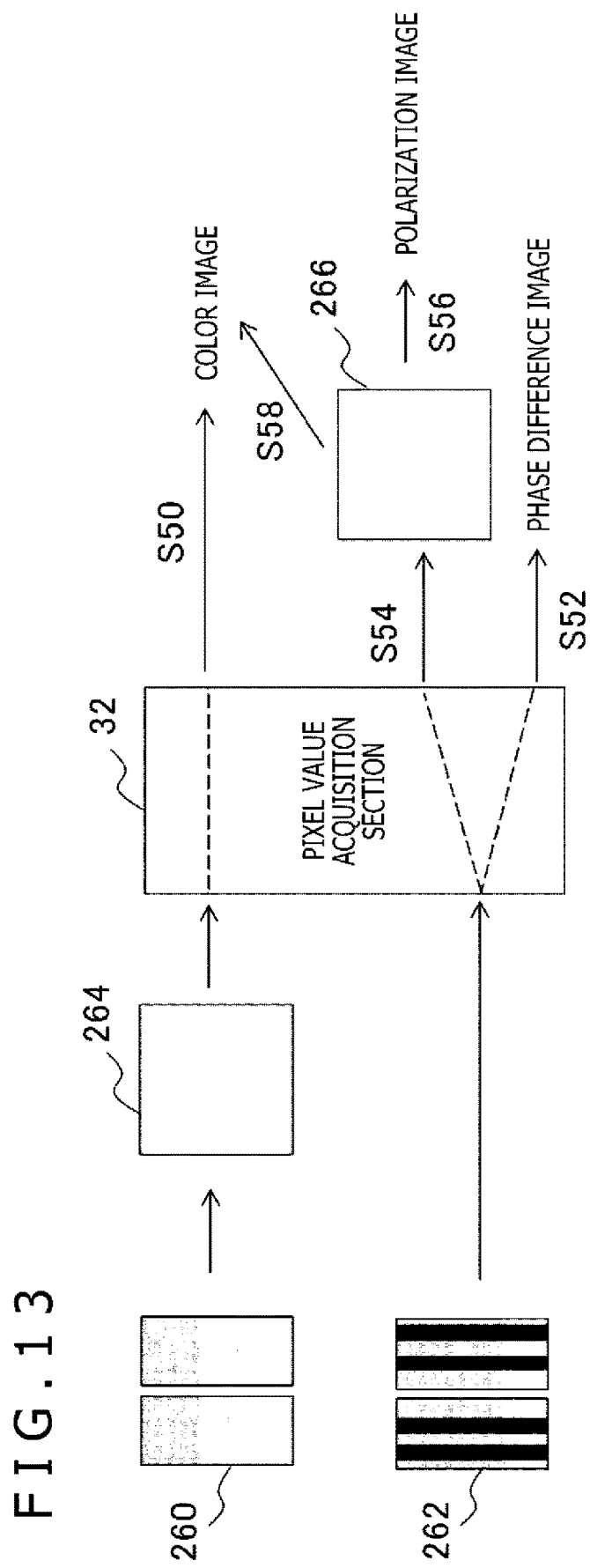
FIG. 13 is a diagram for describing data units and routes through which to generate various pieces of information in the case where units in which data is to be read out is varied depending on whether a polarizer is provided in the present embodiment.
Figure 14:
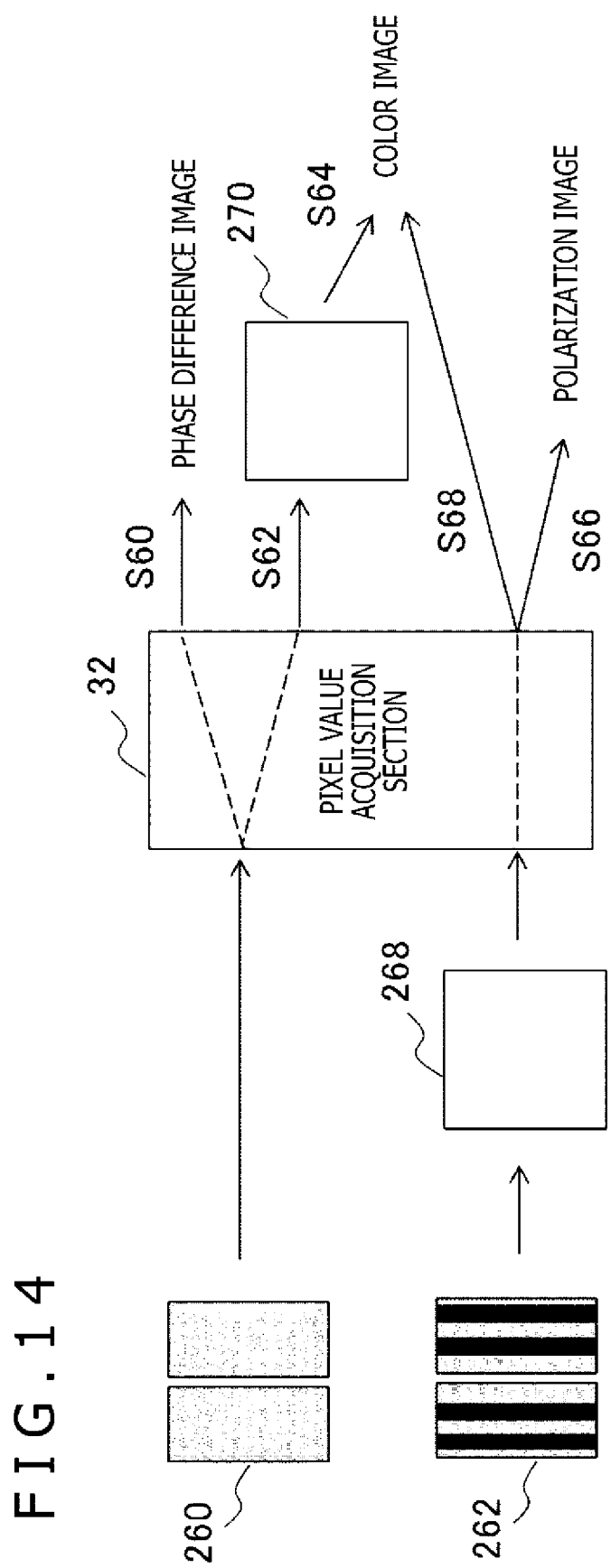
FIG. 14 is a diagram for describing data units and routes through which to generate various pieces of information in the case where units in which data is to be read out is varied depending on whether a polarizer is provided in the present embodiment.

In the modes described so far, the detection values of all the photodiodes are read out individually for extraction of necessary data and interpolation by the image processing section 22. In this case, constraints may arise on the frame rate due to a large amount of time required for data readout as a result of comparison with ordinary pixel values. For this reason, a possible option would be to change the units in which data is to be read out depending on whether a polarizer is provided so as to reduce the time required for readout. FIGS. 13 and 14 are diagrams for describing data units and routes through which to generate various pieces of information in the case where the units in which data is to be read out is varied depending on whether a polarizer is provided.

In the case illustrated in FIG. 13, the detection values of the two photodiodes are summed up for a pixel 260 with no polarizer, and the detection value is read out as a pixel-by-pixel value 264. As for a pixel 262 with a polarizer, on the other hand, each of the detection values of the two photodiodes is read out. These pieces of data are supplied to each functional block via the pixel value acquisition section 32.

The sum of the detection values for the pixel 260 with no polarizer can be used in an 'as-is' manner to generate a color image (S50).

The value detected by each of the two photodiodes for the pixel 262 with a polarizer is used to generate a phase difference image (S52). Also, by summing up the detection values in this stage as a pixel-by-pixel value 266 (S54), the pixel-by-pixel value 266 is used to generate a polarization image and determine a color value of the pixel in question in a color image (S56 and S58). In this case, polarization information and phase difference information are acquired only from the pixels with a polarizer. In an environment where the ratio of the pixels 262 with a polarizer is low and where illuminance is relatively high, taking routes as illustrated in the figure ensures reduced readout time while at the same time maintaining a certain level of accuracy, thus achieving speedup.

In the case illustrated in FIG. 14, each of the detection values of the two photodiodes is read out for the pixel 260 with no polarizer. On the other hand, the detection values of the two photodiodes are summed up for the pixel 262 with a polarizer, and the detection value is read out as a pixel-by-pixel value 268. These pieces of data are supplied to each functional block via the pixel value acquisition section 32. The value detected by each of the two photodiodes for the pixel 260 with no polarizer is used to generate a phase difference image (S60). Also, the detection values are summed up in this stage for use as a pixel-by-pixel value 270 (S62) and is used to generate a color image (S64).

The detection value obtained through summation for the pixel 262 with a polarizer is used in an 'as-is' manner to generate a polarization image or determine a color value of the pixel in question in a color image (S66 and S68). In this case, phase difference information is acquired from pixels other than those with a polarizer. In this case, the sensitivity of phase difference information can be enhanced through comparison with the case illustrated in FIG. 13, thus making it possible to maintain the accuracy constant even in the environment where the illuminance is low. As described above, changing the units in which data is to be read out depending on whether a polarizer is provided ensures reduced readout time while at the same time acquiring necessary information.

It should be noted that the processes illustrated in FIGS. 13 and 14 need not be performed depending on types of information, accuracy, and resolution required. For example, the values of the pixels with a polarizer may not be used to generate a color image, and the values of the surrounding pixels with no polarizer may be interpolated. Also, the units in which data is to be read out and the route for generating data may be optimized in accordance with the accuracy and resolution required for various pieces of data, the surrounding lighting environment, and processing time limitation, and so on. The illuminance or the communication environment for data transmission may be measured, thus switching the units in which to read out data and the route for generating data in accordance with measurement results.

FIG. 15 illustrates polarizer variations in terms of the values of pixels with a polarizer. First, four types of pixels illustrated in (a) have a polarizer with a single principal axis angle for each pixel as has been described so far. Then, changing the principal axis angle every 45 degrees provides the four types of pixels as illustrated in the figure. These pixels are arranged at equal intervals or close to each other in the imaging element 20. If the pixels with a polarizer are dispersed, the pixels with a lower luminance level due to reflection are also dispersed. Therefore, in the case where a phase difference image or a color image is generated by using the pixels with no polarizer, it is possible to fill holes with high accuracy through interpolation.

On the other hand, if the four types of pixels as illustrated in the figure are arranged close to each other such as four pixels in two rows by two columns, it is possible to acquire the change in polarization luminance due to direction approximately at the same position with accuracy, thus ensuring enhanced accuracy in normal vector. The four types of pixels illustrated in (b) have a polarizer only in the region corresponding to one of the pair of photodiodes. In this case, it is possible to acquire the luminance with no polarizer from the other photodiode in the same pixel region, thus allowing for amplification of the luminance level that has declined due to the polarizer with accuracy.

Such an arrangement also allows for acquisition of phase difference with relative accuracy. A possible option, therefore, would be to include the pixels as illustrated in (b) in the imaging element 20 as a whole. Also, the pixels illustrated in (c) have a polarizer with a different principal axis angle in each of the regions corresponding to the photodiode pair. In the example illustrated, two types of pixels are illustrated that have a pair of polarizers whose principal axis angles differ by 90 degrees.

The process of acquiring a distance value from a phase difference basically compares detection value distributions of the left and right photodiodes. On the other hand, the process of acquiring a normal vector from polarization information includes a process of comparing detection values of light that has passed through the polarizers having different principal axis angles. For this reason, if polarizers as illustrated in (c) are used, the process of acquiring a phase difference and the process of acquiring a normal can be commonized in terms of comparison between the detection values of the left and right photodiodes, thus simplifying a drive circuit.

Figure 16:
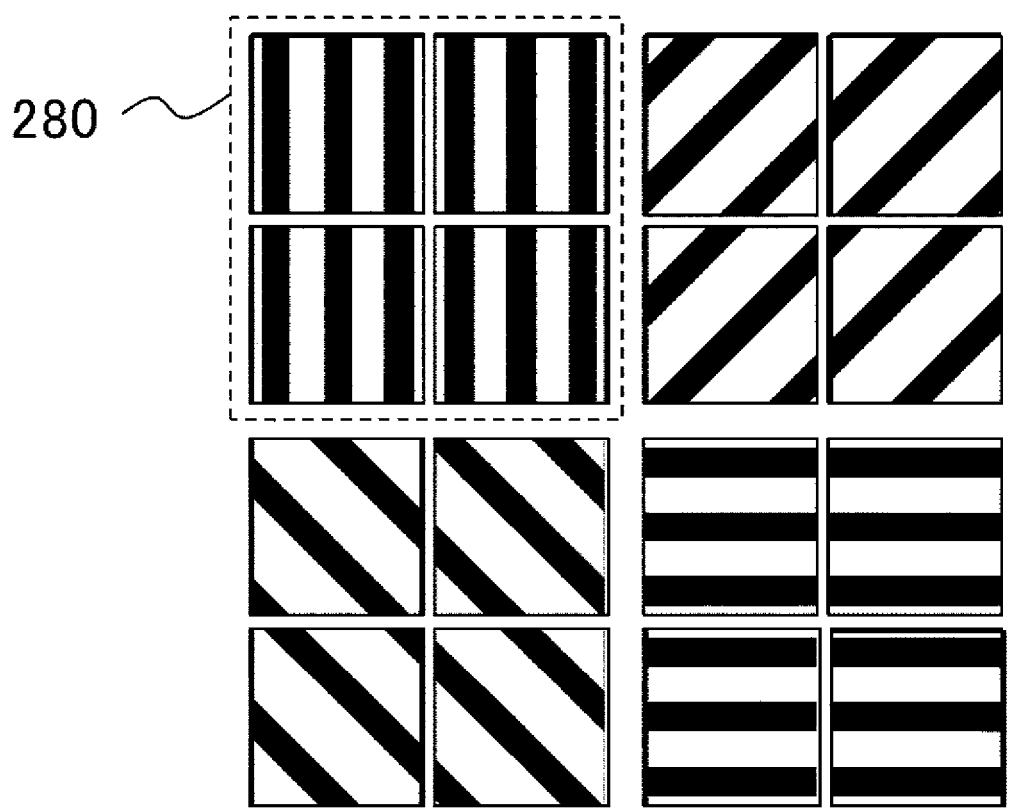
FIG. 16 is a diagram illustrating variations of photodiodes provided in a pixel in the present embodiment.

FIG. 16 illustrates variations of photodiodes provided in a pixel. In the examples described so far, a photodiode was provided in each of the left and right regions obtained by vertically dividing the pixel region into two parts. In this case, phase differences manifest themselves only in the horizontal direction of the image plane. As a result, as described with reference to FIG. 9, the phase difference is undefined for some of the feature points such as horizontal edges, thus making it impossible to acquire a distance value. For this reason, a photodiode may be arranged in each of four regions obtained by dividing a single pixel (e.g., pixel 280) vertically and horizontally respectively into two parts as illustrated in the figure.

In this case, summing up the detection values of the two vertically adjacent photodiodes provides the same phase difference image as with the left and right photodiodes described so far, thus allowing for acquisition of a phase difference between horizontal components. On the other hand, summing up the detection values of the two horizontally adjacent photodiodes provides phase difference images between the upper and lower photodiodes, thus allowing for acquisition of a phase difference between vertical components. As a result, it is possible to acquire a distance value regardless of the feature point direction.

Although a polarizer having a single principal axis angle is provided in each pixel in the examples illustrated, the principal axis angle of the polarizer may be varied or whether a polarizer is provided may be controlled on a photodiode-by-photodiode basis as illustrated in FIG. 15. Also, a photodiode may be arranged in each of four regions obtained by a similar division for the pixels with no polarizer. Such pixels with a polarizer and with no polarizer may be arranged periodically.

Also, color filters of the same color may be used within a pixel. Alternatively, the color may be changed from one photodiode to another. In addition to the above, a photodiode may be provided in each of two regions, upper and lower regions, obtained by dividing the pixel region horizontally. Alternatively, the pixel region may be divided into smaller parts than two rows by two columns so that a photodiode is arranged in each region.

Figure 17:
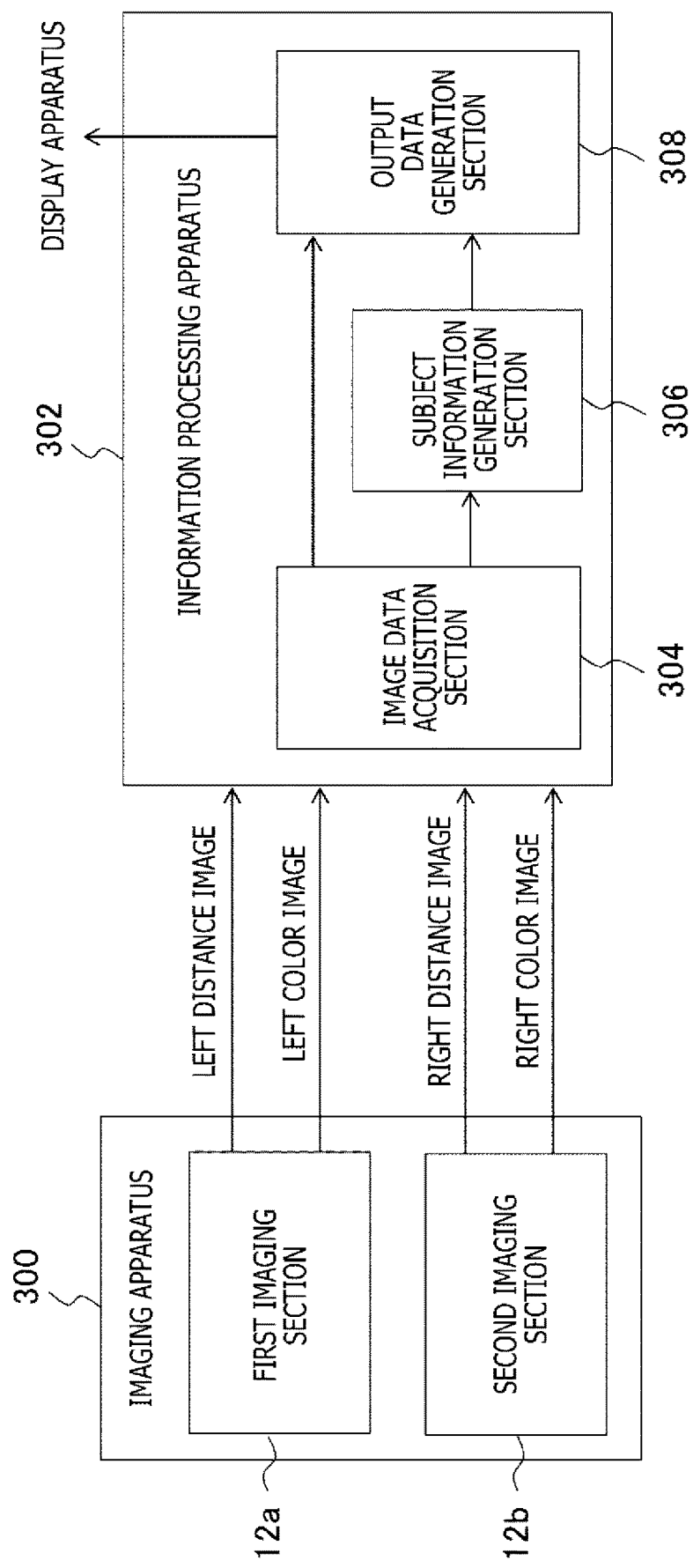
FIG. 17 is a diagram illustrating a configuration of functional blocks of a system when an imaging apparatus includes a stereo camera.

As a modification example of the imaging apparatus 12, a stereo camera may be realized by providing the two imaging apparatuses having the configuration described so far. FIG. 17 illustrates a configuration of functional blocks of a system when the imaging apparatus includes a stereo camera. This system includes an imaging apparatus 300 and an information processing apparatus 302.

The imaging apparatus 300 includes a first imaging section 12a and a second imaging section 12b. Each of the first imaging section 12a and the second imaging section 12b corresponds to the imaging apparatus 12 illustrated in FIG. 1, and these sections are arranged on the left and right with a given space therebetween for use as the imaging apparatus 300. In the description given below, we assume that the first imaging section 12a and the second imaging section 12b are a left viewpoint camera and a right viewpoint camera, respectively. Each of the first imaging section 12a and the second imaging section 12b includes an image processing section having the function described with reference to FIG. 8. Therefore, the first imaging section 12a of the imaging apparatus 300 outputs left viewpoint distance image and color image data, and the second imaging section 12b outputs right viewpoint distance image and color image data.

The information processing apparatus 302 includes an image data acquisition section 304, a subject information generation section 306, and an output data generation section 308. The image data acquisition section 304 acquires image data from the imaging apparatus 300. The subject information generation section 306 generates comprehensive information regarding the subject's position and posture by combining these image data. The output data generation section 308 generates output data by using comprehensive information. The image data acquisition section 304 acquires the distance image and color image data acquired at least for each of the left and right viewpoints from the imaging apparatus 300.

The subject information generation section 306 generates final information regarding the subject's position, posture, shape, and so on by combining the distance images acquired from the imaging apparatus 300. That is, as for the portions of the subject invisible from one of the first imaging section 12a and the second imaging section 12b, the portions with an undefined distance are minimized by replenishing the data with the other distance image. Further, the subject information generation section 306 may separately generate, by the principle of triangulation, distance images by using left and right viewpoint color images or left and right viewpoint luminance images and combine the distance images.

Figure 18:
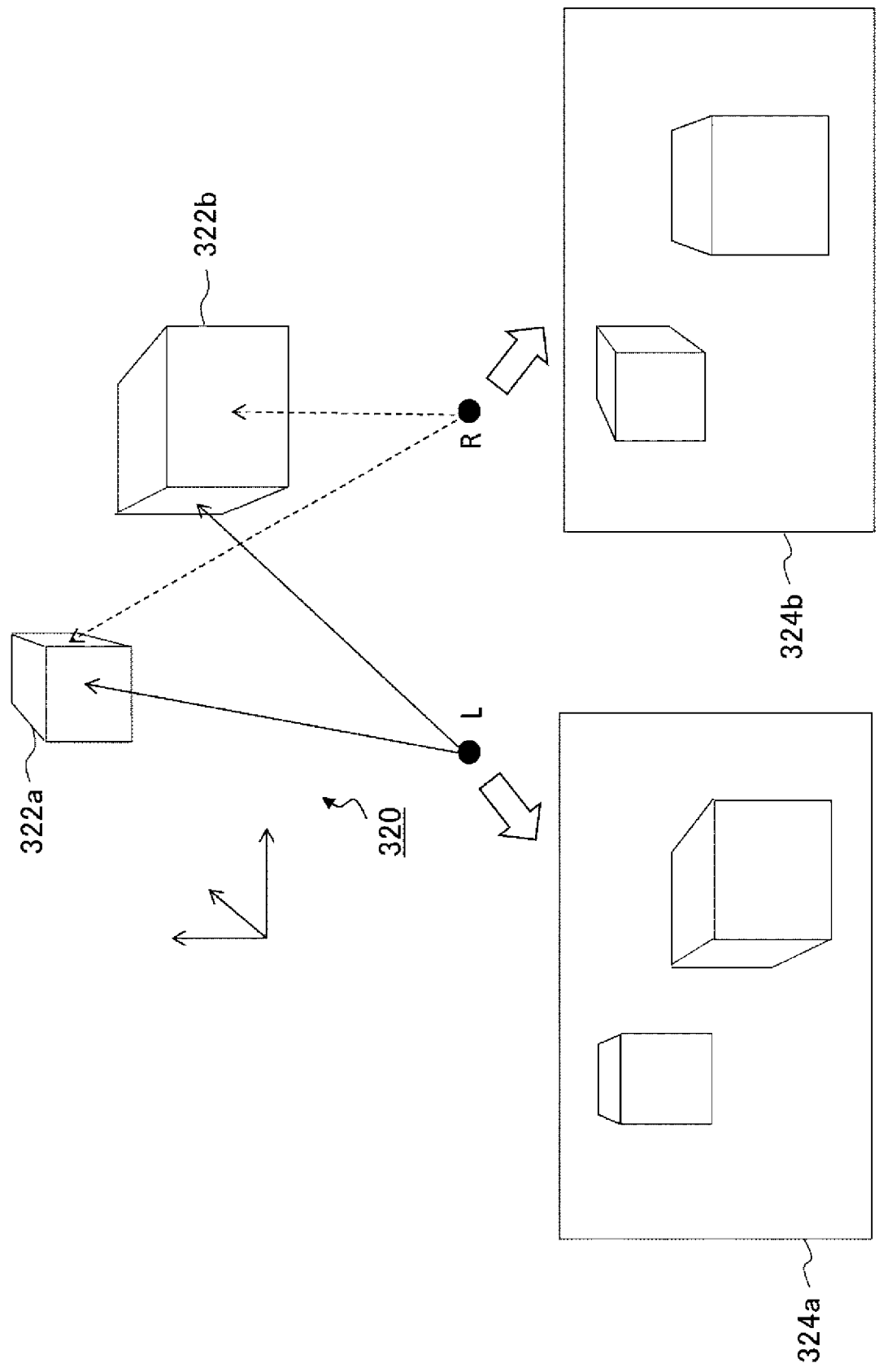
FIG. 18 is a diagram for describing a process performed by a subject information generation section to combine left and right viewpoint distance images in the present embodiment.

The output data generation section 308 generates data to be output such as display image by using left and right viewpoint color images and distance images. In the case where a display image is generated, the image is subjected to ordinary processes at the time of output such as linear matrix (color matrix) and gamma correction, after which the image is output to the display apparatus. FIG. 18 is a diagram for describing a process performed by the subject information generation section 306 to combine left and right viewpoint distance images. If a 3D space 320 where two cubes 322a and 322b exist from left and right viewpoints L and R as illustrated at the top in FIG. 18, a left viewpoint image 324a and a right viewpoint image 324b are acquired.

The region where the first imaging section 12a and the second imaging section 12b can acquire a distance value on their own is limited to the portions that appear as a silhouette in the left viewpoint image 324a and a right viewpoint image 324b, respectively. In the example illustrated, the left side surface of the cube 322b is visible only from the left viewpoint L, and the right side surface of the cube 322a is visible only from the right viewpoint R. Therefore, the distance values thereof are included only in one of the distance images. Therefore, the subject information generation section 306 curtails the regions with an undefined distance value by applying the value of the other distance image to the regions of the subject where no distance value has yet to be acquired with one of the distance images.

As a result, a model space closer to the 3D space 320 can be realized. That is, the subject information generation section 306 can generate information regarding the subject's position in the world coordinate system that is not limited to a single viewpoint by combining the distance images from a plurality of viewpoints. The position in question can be acquired for each minute region on the subject surface. As a result, this means that the subject's posture and shape are also found.

It should be noted that, as for the regions visible from both viewpoints, two distance values are available. Therefore, it is possible to enhance the accuracy by using, for example, the mean value thereof as a distance value. Further, the subject information generation section 306 may also generate itself distance images by using color images of left and right viewpoints and further combine the results thereof. In this case, distance values for portions visible from both viewpoints are further acquired. As a result, three distance values are available for the portion in question. The accuracy can be enhanced further by using the average thereof as a distance value. It should be noted, however, that the processing time can be reduced by omitting the generation of distance images using color images depending on the required accuracy.

It should be noted that the subject information generation section 306 may further fill distance value holes and further enhance the accuracy by other means. For example, deep leaning technology is on the way to commercialization as machine learning using a neural network. By taking advantage of this technology, the subject information generation section 306 is caused to learn how to derive a distance value or its change from a color or its change, a silhouette shape, and so on in a color image. Then, by using a color image actually acquired, the distance value of a region invisible from the viewpoints of the imaging apparatus may be estimated, or the distance value of a visible region may be enhanced by correction.

This technique is similarly effective for distance image data output from the imaging apparatus 12. Therefore, a subject information generation section having the same function may be provided in the information processing apparatus, not illustrated, that is connected to the imaging apparatus 12. This function is particularly effective in expanding the regions where distance values can be acquired and enhancing the accuracy in the case where the viewpoints of the imaging apparatus are limited or in a shooting environment with insufficient luminance. It should be noted that the functions of the information processing apparatus 302 including the subject information generation section 306 and some of the functions of the imaging apparatus 300 may be provided in other apparatus connected to a network or shared among a plurality of apparatuses to perform arithmetic operations. At this time, the information processing apparatus 302 and the display apparatus, not illustrated, may sequentially acquire results thereof and perform their own processes as appropriate or display an image in accordance with the results.

Figure 19:
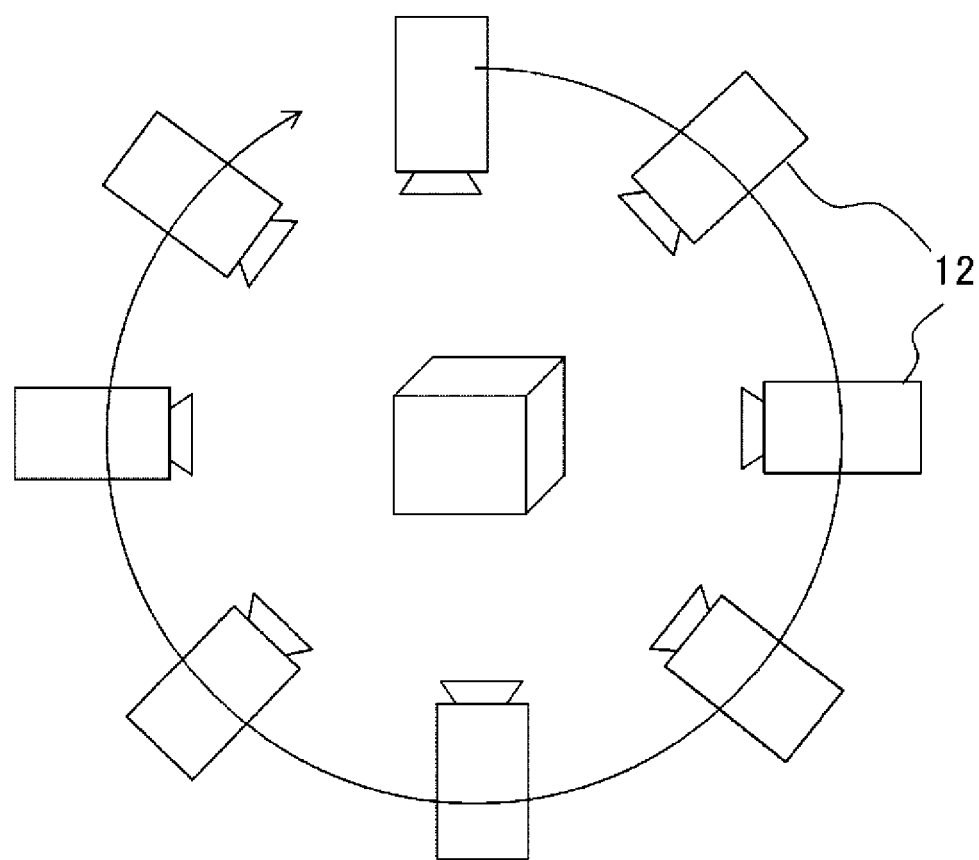
FIG. 19 is a diagram for describing a technique for acquiring information regarding a subject state in a 3D space while at the same time moving the imaging apparatus.

Also, as illustrated in FIG. 17, by using a stereo camera as the imaging apparatus 300, it is possible to acquire the distance value of a region that is not visible with a monocular imaging apparatus. By developing this idea, the imaging apparatus 12 may be movable so that the regions where distance values can be acquired are further expanded. FIG. 19 is a diagram for describing a technique for acquiring information regarding subject states such as position, posture, shape, and so on in a 3D space through shooting while at the same time moving the imaging apparatus 12.

The illustrated example depicts the manner in which the imaging apparatus 12 is moved in a circular trajectory around a cube, the subject. Here, an acceleration sensor is provided in the imaging apparatus 12 so that a shooting time, a shot image, and the position and posture of the imaging apparatus 12 in the 3D space are recorded in association with each other. Then, acquired data is filled into a model space like the 3D space 320 illustrated in FIG. 18 on the basis of the color image and the distance image acquired for the viewpoint at each shooting time of a given rate. Such a process may be performed by the distance image generation section 38 in the imaging apparatus 12 or the subject information generation section 306 of the information processing apparatus 302.

If the process is performed inside the imaging apparatus 12, the processing burden on the information processing apparatus 302 can be reduced, thus keeping the increase in processing time to a minimum. It should be noted that how the imaging apparatus 12 is moved is not limited to that illustrated. For example, the imaging apparatus 12 may be moved within the range corresponding to the range of motion of a virtual viewpoint for a final image to be displayed. Alternatively, shot images in all directions may be acquired by rotating the imaging apparatus 12. Also, memory consumption can be kept to a minimum by ideas for improvement such as accumulating, of the pieces of data acquired by moving the imaging apparatus 12 in this manner, only the distance values for the feature points.

Alternatively, similar information can be acquired by arranging three or more shot images rather than moving the imaging apparatus 12. Also, in this case, the plurality of imaging apparatuses 12 are arranged in such a manner as to face each other in such a manner that optical axes converge near the subject. Alternatively, the imaging apparatuses 12 may be arranged in opposite orientation to the above in such a manner that the optical axes diverge outward. In these cases, color images and distance images from a plurality of viewpoints can be acquired at the same time of day. Therefore, these images may be connected together by a stitching process for use as wide angle information. At this time, the imaging apparatus 12 having the functional blocks illustrated in FIG. 8 may be used as only some of the plurality of imaging apparatuses provided.

For example, only the imaging apparatus that shoots a subject whose detailed information in a real space is desired includes a function to generate a distance image, and other imaging apparatuses generate only color images. This makes it possible to find detailed information regarding positions and postures of main subjects such as athletes while at the same time shooting a spacious stadium in all directions. As a result, it is possible to concentrate processing resources on a required target by performing subsequent processes including retouch and superimposition of virtual objects with high accuracy.

Figure 20:
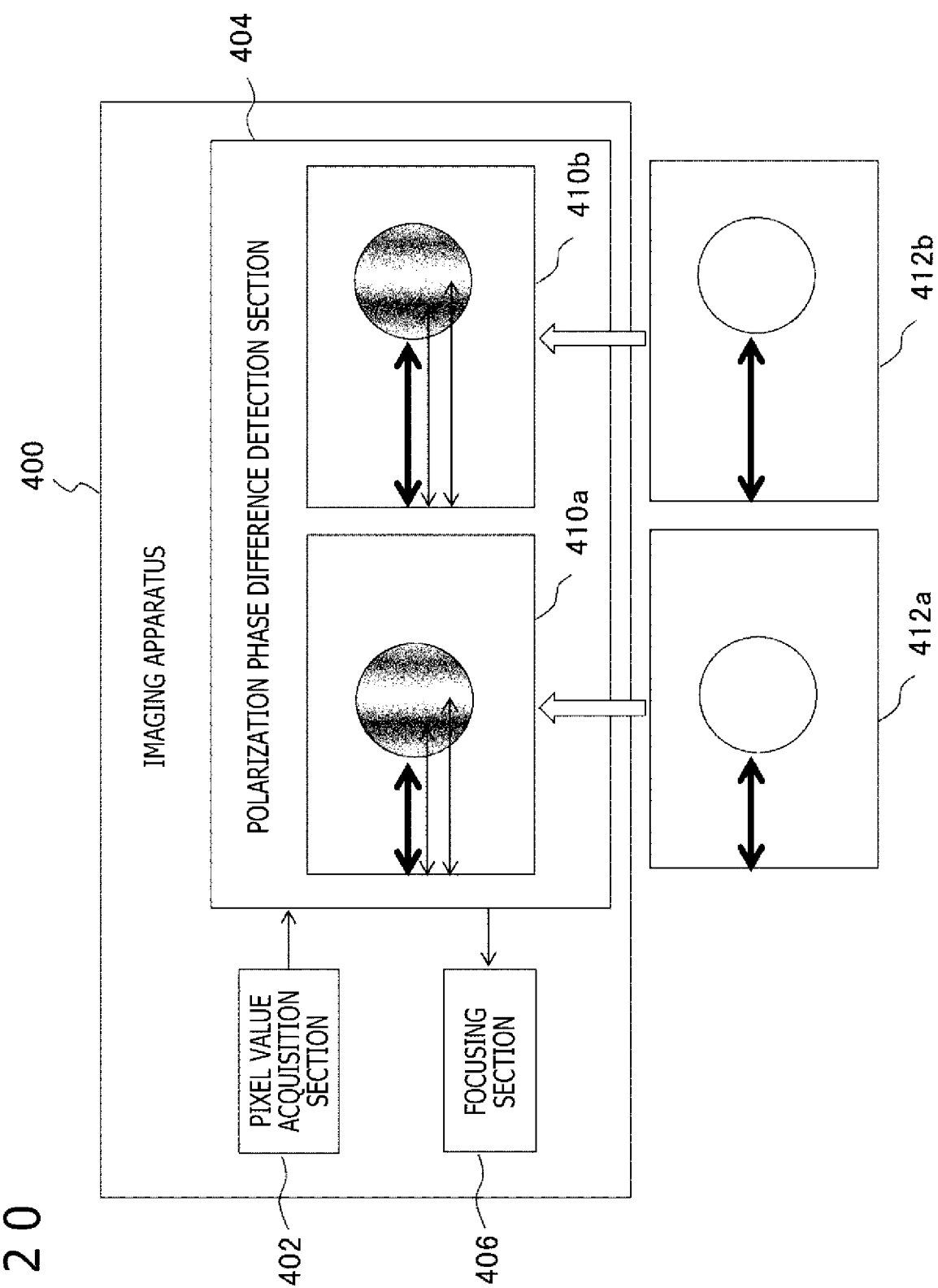
FIG. 20 is a diagram illustrating functional blocks of the imaging apparatus having a function to achieve focus using phase difference between polarizations in the present embodiment.

In the configuration of the imaging element in the present embodiment, light that has passed through the polarizer is detected by two photodiodes, thus allowing for acquisition of phase difference between polarization images. By taking advantage of this acquisition, the accuracy of a focusing function through phase difference between polarizations can be enhanced. FIG. 20 illustrates functional blocks of the imaging apparatus having a function to achieve focus through phase difference between polarizations. An imaging apparatus 400 includes a pixel value acquisition section 402, a polarization phase difference detection section 404, and a focusing section 406. The pixel value acquisition section 402 acquires a detection value of each photodiode. The polarization phase difference detection section 404 detects a phase difference between polarization images from the detection values of the two photodiodes of a pixel with a polarizer. The focusing section 406 adjusts the lens position on the basis of the phase difference between polarizations, thus allowing focus to be achieved at a proper position.

The pixel value acquisition section 402 reads out the detection values of the photodiodes in at least the pixels with a polarizer and performs given preprocessing such as A/D conversion and clamping process. The polarization phase difference detection section 404 separates polarization luminance distributions detected by the left and right photodiodes, thus generating polarization images in four directions for each of the distribution. Then, the polarization phase difference detection section 404 generates, as a phase difference image, a degree-of-polarization image that represents the degree of polarization acquired by using Formula 2 on the image plane or a normal image representing the normal vector acquired from the degree of polarization on the image plane. FIG. 20 illustrates phase difference images 410a and 410b using polarization generated in this manner.

Also, phase difference images 412a and 412b of ordinary natural light are illustrated at the bottom in FIG. 20 for comparison. In the example illustrated, a disk-shaped subject appears. In the case where the subject surface is monochromatic with a relatively smooth shape, the subject's outline is acquired as feature points in the phase difference images 412a and 412b of ordinary natural light. On the other hand, scant information is available regarding the subject surface. Even unevenness subject surface may not be captured as feature points due to a small change in luminance depending on lighting. Therefore, in the case where the positions of the feature points of the images 412a and 412b are identified as indicated by arrows and focus is achieved from the phase difference therebetween, it may not be possible to perform accurate adjustment due to scantiness of information.

On the other hand, the phase difference images 410a and 410b representing a degree of polarization or a normal vector represents undulation of the subject surface. As a result, the sensitivity to shape is higher than in the natural light images, making these images less prone to lighting. For this reason, even if the silhouette has a uniform look, variations occur as an image according to the shape as illustrated in the figure. Therefore, more feature point positions as grounds for phase difference are acquired as illustrated by the arrows. A more accurate and speedy adjustment can be realized by combining the positional relationships therebetween, deriving a phase difference, and performing the focusing process on the basis of the phase difference.

The focusing section 406 adjusts the lens by deriving its proper position on the basis of phase difference as in an ordinary focusing process. It should be noted that although attention is centered solely on the focusing function in depicting the functional blocks of the imaging apparatus 400 illustrated in the figure, it may be possible to output a distance image and a color image based on luminance data resulting from highly accurate focus by combining with the image processing section 22 illustrated in FIG. 8.

In the present embodiment described above, an imaging element includes a plurality of photodiodes provided per microlens, with a polarizer provided in an intermediate layer between at least some of the microlenses and the photodiodes. This allows for simultaneous acquisition of a polarization image and a phase difference image. Then, on the basis of the phase difference, distances at feature points of a subject are found, then the distances between the feature points are interpolated by using normal vectors acquired from polarization. This provides distance values for a spacious region of a shot image despite the fact that the camera is monocular.

In a distance measuring technology using an ordinary stereo camera, the distance is undefined for the surface of a subject that appears in an image from one of the viewpoints but does not appear in an image from the other viewpoint. The above technique of the present embodiment allows for derivation of a distance as long as the subject appears in a shot image, thus providing, in some cases, more pieces of distance data than when a stereo camera is used. This makes it possible to use the imaging apparatus in place of a stereo camera, thus downsizing the imaging apparatus having a distance measuring function.

Also, if such an imaging apparatus is realized as a stereo camera, the results of left and right shot images can be combined, thus providing distance values in an even wider range and allowing for the subject's position and posture in a 3D space to be realized with high accuracy. Further, finding distance images as conventionally done with color images from left and right viewpoints and combining the distance images ensures improved accuracy in distance information. These techniques are not dependent upon light in a specific wavelength band such as infrared light, thus allowing for acquisition of information outdoors and at other locations.

Also, it is possible to control those pixels with a polarizer and others with no polarizer properly, thus allowing for generation of color and phase difference images with conventional luminance levels. This makes the present embodiment applicable to any kinds of information processing tasks with no restrictions imposed on subsequent processes. Also, the processes of acquiring distance values on the basis of phase difference, generating normal images on the basis of polarization, and combining these to generate distance images can be basically performed row by row or every several rows of the image plane. Therefore, these processes can be implemented with the arithmetic circuit provided in the imaging apparatus by using line buffers. As a result, the functions can be shared with the apparatus that performs information processing tasks using various types of data and the apparatus that performs a display process, thus making it possible to handle shooting and display at a high frame rate.

Further, it is possible to acquire a phase difference between polarizations, thus allowing for extraction of changes in shape as feature points with high sensitivity even when the subject surface has scant undulation which would otherwise not be extracted as feature points in a natural light image. This makes it possible to acquire a large number of pieces of information as grounds for phase difference, thus ensuring even higher accuracy in the conventional focusing function. It should be noted that even in the case where the present embodiment is realized a stereo camera, more feature points can be acquired than in a natural light luminance image by using a degree-of-polarization image and a normal image, thus ensuring improved accuracy in generating a distance image by acquiring corresponding points from left and right viewpoint images.

The present invention has been described above on the basis of the present embodiment. It is to be understood by those skilled in the art that the above embodiment is illustrative, that various modification examples are possible in terms of a combination of constituent elements and processes, and that these modification examples also fall within the scope of the present invention.

For example, although photodiodes were used in the present embodiment, a mechanism mainly in charge of detection is not limited to photodiodes as long as the mechanism converts light into electric charge. For example, an organic photoelectric conversion film may be used as some or all the photodiodes. For example, the material and structure of the organic photoelectric conversion film can be determined as appropriate by using known technologies recited in PCT Patent Publication No. WO2014/156659 and other documents.

Also, the present embodiment may be used in combination with a technology that measures distance by shining light in a specific wavelength band such as infrared light. That is, a mechanism for shining reference light is provided in the imaging apparatus 12, and reflected light thereof is detected by photodiodes. Shining reference light in a random pattern makes it possible to create feature points even on a subject surface with scant feature points. The processes performed by the image processing section are similar to those in the present embodiment. However, feature points abound as grounds for phase difference. Therefore, distance values based on phase difference can be acquired at a number of locations. This ensures improved accuracy in interpolating using normal vectors, thus allowing for acquisition of more accurate distance information. An illuminance sensor may be further provided in the imaging apparatus 12, thus shining reference light in the case where the illuminance is lower than a given value and preventing deterioration of the analysis accuracy caused by decline in illuminance.

Further, the imaging apparatus of the present embodiment may be realized by an ordinary camera whose principal function is to acquire color images. Alternatively, the imaging apparatus of the present embodiment may be provided in other apparatus having an imaging function. For example, the imaging apparatus of the present embodiment may be provided in a multifunctional mobile phone, a mobile terminal, a personal computer, a capsule endoscope, a wearable terminal, and so on. In the case where such an apparatus does not need to acquire a color image, the functions of the defect correction section 40 and the color image generation section 42 may be omitted, and only a distance image may be output. In this case, the color filter layer of the imaging element may be omitted.

Also, although each of all the pixel regions were in principle divided into partial regions with a photodiode provided in each partial region in the imaging element of the present embodiment, some pixels may include a single photodiode to correspond to one microlens without any division into partial regions. In this case, a phase difference image is acquired from the other pixel. Alternatively, conversely to the above, a plurality of photodiodes may be provided only in the pixels with a polarizer. In either case, the process of summing up the detection values described in the present embodiment can be omitted to provide a similar effect.

REFERENCE SIGNS LIST

12 Imaging apparatus, 20 Imaging element, 22 Image processing section, 30 Focal distance acquisition section, 32 Pixel value acquisition section, 34 Feature point distance acquisition section, 36 Normal image generation section, 38 Distance image generation section, 40 Defect correction section, 42 Color image generation section, 44 Output section, 46 Phase difference detection section, 48 Distance value acquisition section, 110 Pixel, 112 Microlens layer, 114 Color filter layer, 116 Polarizer layer, 118 Photoelectric conversion layer, 300 Imaging apparatus, 302 Information processing apparatus, 304 Image data acquisition section, 306 Subject information generation section, 308 Output data generation section, 400 Imaging apparatus, 402 Pixel value acquisition section, 404 Polarization phase difference detection section, 406 Focusing section.

INDUSTRIAL APPLICABILITY

As descried above, the present invention can find application in various pieces of electronic equipment such as imaging apparatus, gaming console, mobile terminal, personal computer, and wearable terminal and a system including these pieces of electronic equipment.

The invention claimed is:
1. An imaging apparatus including, in a pixel arrangement,
a microlens,
a polarizer layer including a polarizer that allows passage, of light that has passed through the microlens, of a polarization component in a given direction, and
a photoelectric conversion section that is a unit of conversion of light that has passed through the microlens into electric charge,
the imaging apparatus comprising:
an imaging element including a pixel having a plurality of the photoelectric conversion section that converts light in a common wavelength band into electric charge in a pixel region corresponding to the single microlens,
an image processing section including
a feature point distance acquisition section adapted to extract respective detection values of the photoelectric conversion sections at a same position in the respective pixel regions, acquire a phase difference between feature points of a subject by comparing distributions thereof, and identify distance values of the feature points on a basis of the phase difference,
a normal image generation section adapted to acquire a normal vector distribution of the subject on a basis of the detection values of the polarization components, and a distance image generation section adapted to generate subject distance information by using the feature point distance values and the normal vector distribution.

2. The imaging apparatus of claim 1, wherein the polarizer layer includes pixel regions with the polarizer and pixel regions with no polarizer.

3. The imaging apparatus of claim 2, further comprising:
a readout control section adapted to perform control such that electric charges of a plurality of photoelectric conversion sections included in one of the pixel region with the polarizer and the pixel region with no polarizer are summed up and read out.

4. The imaging apparatus of claim 2, further comprising:
a readout control section adapted to read out the electric charge at different timings between the pixel region with the polarizer and the pixel region with no polarizer.

5. The imaging apparatus of claim 1, wherein at least either a shape of the polarizer or its position in the pixel region changes depending on a position of the imaging surface of the imaging element.

6. The imaging apparatus of claim 1, wherein the polarizer layer includes pixel regions with the polarizer and pixel regions with no polarizer, and the feature point distance acquisition section uses either the pixel regions with the polarizer or pixel regions with no polarizer as an output source of detection values to be used for identifying the distance values.

7. The imaging apparatus of claim 1, wherein the polarizer layer includes, in each pixel region, the region with the polarizer and the region with no polarizer.

8. The imaging apparatus of claim 1, wherein the polarizer layer includes polarizers whose principal axis angles are different depending on the partial region obtained by dividing each pixel region.

9. The imaging apparatus of claim 1, further comprising:
a plurality of imaging sections, each including the imaging element and the image processing section, in such a manner that viewpoints thereof are different.

10. The imaging apparatus of claim 9, further comprising:
an information processing apparatus adapted to acquire the distance information from each of the plurality of imaging sections, generate information regarding a subject's position in a three-dimensional space by combining these pieces of distance information, and output the subject's position information.

11. The imaging apparatus of claim 10, wherein the information processing apparatus further acquires shot image data based on a second-dimensional distribution of the detection values from each of the plurality of imaging sections and further combines pieces of distance information generated on a basis of phase differences therebetween.

12. The imaging apparatus of claim 10, wherein the information processing apparatus further acquires shot image data based on a second-dimensional distribution of the detection values from each of the plurality of imaging sections, estimates a distance value of a region of the subject not shot by any of the plurality of imaging sections on a basis of a relationship between the shot image and a distance value of a subject's silhouette acquired by machine learning, and interpolates information regarding the subject's position in the three-dimensional space.

13. The imaging apparatus of claim 1, further comprising:
an imaging section including the imaging element and the image processing section; and
another imaging section adapted to shoot and output a color image in such a manner that viewpoints thereof are different.

14. The imaging apparatus of claim 1, further comprising:
a polarization phase difference detection section adapted to extract respective detection values of the photoelectric conversion sections corresponding to the light that has passed through the polarizer at a same position in the respective pixel regions and acquire a phase difference between feature points of a subject by comparing degrees of polarization or subject normal vector distributions generated, respectively, by using a detection value distribution; and
a focusing section adapted to make adjustment such that focus is achieved at a given position on a basis of the phase difference.

15. The imaging apparatus of claim 1, wherein the distance image generation section generates, as the distance information, a distance image having a subject's distance value as a pixel value for each image frame shot by the imaging element at a given frame rate and outputs an image, obtained by averaging the distance images generated for a given number of image frames, at time intervals corresponding to the given number of image frames.

16. The imaging apparatus of claim 1, wherein the imaging element has a structure in which the pixel arrangement and a logic circuit that performs at least some of processes of the image processing section are stacked one on top of the other.

17. The imaging apparatus of claim 1, further comprising:
an information processing apparatus adapted to sequentially acquire the distance information generated by the imaging apparatus by shooting from different viewpoints, generate information regarding a subject's position in a three-dimensional space by combining these pieces of distance information, and output the subject's position information.

* * * * *